United States Patent
Saitou et al.

(10) Patent No.: US 8,438,724 B2
(45) Date of Patent: May 14, 2013

(54) METHOD FOR PRODUCING SUBSTRATE FOR MOUNTING DEVICE AND METHOD FOR PRODUCING A SEMICONDUCTOR MODULE

(75) Inventors: Kouichi Saitou, Ogaki (JP); Yoshio Okayama, Gifu (JP); Yoh Takano, Ogaki (JP); Mayumi Nakasato, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/900,175

(22) Filed: Oct. 7, 2010

(65) Prior Publication Data

US 2011/0027945 A1   Feb. 3, 2011

Related U.S. Application Data

(63) Continuation of application No. 12/345,019, filed on Dec. 29, 2008, now abandoned.

(30) Foreign Application Priority Data

Dec. 27, 2007   (JP) .................................. 2007-335819
Mar. 31, 2008   (JP) .................................. 2008-091664

(51) Int. Cl.
*H05K 3/30*   (2006.01)
*H01L 21/82*  (2006.01)

(52) U.S. Cl.
USPC ........................................... 29/832; 438/128

(58) Field of Classification Search ............ 29/832, 29/840, 846; 174/250, 253, 255, 260–262; 438/128, 129
See application file for complete search history.

(56) References Cited

U.S. PATENT DOCUMENTS 5,029,042 A * 7/1991 Dean ........................... 361/321.2
5,161,086 A * 11/1992 Howard et al. ............ 361/321.1
(Continued)

FOREIGN PATENT DOCUMENTS

JP   2002-118210 A   4/2002
JP   2004-193297      7/2004
(Continued)

OTHER PUBLICATIONS

Japanese Notification of Reason(s) for Refusal, w/ English translation thereof, issued in Japanese Patent Application No. JP 2007-335819 dated Aug. 17, 2010.

(Continued)

*Primary Examiner* — David Angwin
(74) *Attorney, Agent, or Firm* — McDermott Will & Emery LLP

(57) ABSTRACT

Methods for producing a substrate for mounting a device and for producing a semiconductor module are provided. The methods comprise preparing a metal plate on one major surface of which a plurality of projected electrodes are provided. An insulating resin layer is formed on the major surface so as to cover the top surface of the projected electrodes. The top surface of at least one of the plurality of projected electrodes is exposed by removing the insulating resin layer so that a major surface of the insulating resin layer opposite to the metal plate is level. A plurality of counter electrodes is arranged having a counterface to face the top face of the plurality of projected electrodes or a semiconductor device having a plurality of device electrodes is arranged to face the top face of the plurality of projected electrodes. The at least one of the plurality of projected electrodes, the top surface of which is exposed, is electrically connected with at least one of the plurality of counter electrodes facing the projected electrodes, by pressure-bonding the metal plate with the counter electrode. A wiring layer is formed by selectively removing the metal plate.

7 Claims, 26 Drawing Sheets

U.S. PATENT DOCUMENTS

| | | | |
|---|---|---|---|
| 5,177,670 A * | 1/1993 | Shinohara et al. | 361/738 |
| 5,600,103 A * | 2/1997 | Odaira et al. | 174/265 |
| 5,736,681 A * | 4/1998 | Yamamoto et al. | 174/265 |
| 6,048,430 A * | 4/2000 | Johnston | 156/233 |
| 6,121,553 A * | 9/2000 | Shinada et al. | 174/259 |
| 6,447,888 B2 * | 9/2002 | Suzuki et al. | 428/210 |
| 6,541,137 B1 * | 4/2003 | Kingon et al. | 428/701 |
| 6,608,760 B2 * | 8/2003 | Hartman et al. | 361/762 |
| 6,815,085 B2 * | 11/2004 | Appelt et al. | 428/626 |
| 6,970,362 B1 * | 11/2005 | Chakravorty | 361/782 |
| 7,397,000 B2 * | 7/2008 | Shimoto et al. | 174/258 |
| 7,982,139 B2 * | 7/2011 | Kariya et al. | 174/260 |
| 8,163,642 B1 * | 4/2012 | Wang | 438/612 |
| 8,164,920 B2 * | 4/2012 | Kariya | 361/794 |
| 2002/0011662 A1 * | 1/2002 | Komiya et al. | 257/728 |
| 2002/0180063 A1 * | 12/2002 | Iwaki et al. | 257/778 |
| 2003/0063453 A1 * | 4/2003 | Kusagaya et al. | 361/794 |
| 2003/0202314 A1 * | 10/2003 | Appelt et al. | 361/301.4 |
| 2004/0099999 A1 * | 5/2004 | Borland | 264/618 |
| 2004/0145858 A1 * | 7/2004 | Sakurada | 361/600 |
| 2006/0137905 A1 * | 6/2006 | Kariya et al. | 174/255 |
| 2009/0250251 A1 * | 10/2009 | Shibata et al. | 174/255 |

FOREIGN PATENT DOCUMENTS

| | | |
|---|---|---|
| JP | 2004-247483 | 9/2004 |
| JP | 2004-349361 | 12/2004 |
| JP | 2005-005548 | 1/2005 |
| JP | 2005-197532 | 7/2005 |
| JP | 2007-059529 | 3/2007 |
| JP | 2007-123798 | 5/2007 |
| JP | 2007-173749 A | 7/2007 |
| WO | WO 2007/063954 A1 | 6/2007 |

OTHER PUBLICATIONS

Japanese Office Action, with English translation thereof, issued in Japanese Patent Application No. 2007-335819, dated Feb. 1, 2011.

Japanese Notification of Reason(s) for Refusal, w/ English translation thereof, issued in Japanese Application No. JP 2007-335819 dated Nov. 9, 2010.

Chinese Office Action, w/ English translation thereof, issued in Chinese Patent Application No. CN 200810191061.5 dated Jan. 30, 2012.

Japanese Office Action, with English translation, issued in Japanese Patent Application No. 2008-091664, dated Jan. 17, 2012.

* cited by examiner

METHOD FOR PRODUCING SUBSTRATE FOR MOUNTING DEVICE AND METHOD FOR PRODUCING A SEMICONDUCTOR MODULE

CROSS-REFERENCE TO RELATED APPLICATIONS

This application is a Continuation of U.S. patent application Ser. No. 12/345,019, filed on Dec. 29, 2008, now abandoned which is based upon and claims the benefit of priority from the prior Japanese Patent Applications No. 2007-335819, filed Dec. 27, 2007, and Japanese Patent Application No. 2008-091664, filed Mar. 31, 2008, the entire contents of which are incorporated herein by reference.

BACKGROUND OF THE INVENTION

1. Field of the Invention

The present invention relates to a substrate for mounting a device and a method for producing the same, a semiconductor module and a method for producing the same, and a portable apparatus provided with the same.

2. Description of the Related Art

Amid the acceleration of high performance of portable electronic apparatuses such as portable phone, PDA, DVC, and DSC, in order to be accepted in the market, it is essential that such products are miniaturized and reduced in their weight. Hence, there is also a demand for miniaturization of semiconductor modules such as multi-chip module (MCM) or the like used in these electronic apparatuses. With respect to the demand, a semiconductor device is known in which an active device such as a semiconductor chip, and a passive device such as a capacitor, are covered by an insulating layer formed on a substrate, and the active device and the passive device are connected to a wiring on the insulating layer via the insulating layer. In recent years, with miniaturization and high performance of electronic apparatuses, there is a demand for further miniaturization of semiconductor devices used in the electronic apparatuses. With miniaturization of semiconductor devices, it is essential to narrow a pitch between electrodes for being implemented on a printed wiring board. As a surface-mounting method of a semiconductor device, a flip-chip mounting method is known in which a solder bump is formed on an electrode of the semiconductor device, and the solder bump and an electrode pad of a printed wiring board are soldered. However, in the flip-chip mounting method, there are limitations in narrowing the pitch between electrodes, because of restrictions resulting from the size of the solder bump itself and occurrence of bridges while soldering, or the like. As a structure for overcoming these restrictions, a structure is known in which a projected structure formed on a substrate is used as an electrode or a via, and a semiconductor device is mounted on the substrate via an insulating resin such as an epoxy resin, such that an electrode of the semiconductor device is connected to the projected structure.

However, in the conventional semiconductor devices, there are problems that miniaturization of a semiconductor module is suppressed and the number of the production processes is increased, because a passive device such as a capacitor or the like is mounted on a silicon substrate as a separate part. Further, in the structure in which a wiring layer of a substrate for mounting a device and a semiconductor device are made into one body via an insulating resin, such that a projected structure provided on the wiring layer and an electrode of the semiconductor device are connected, adhesion between the insulating resin and the semiconductor device is not high. Therefore, there is a fear that the insulating resin could peel from the semiconductor device by a thermal stress generated due to, for example, a change in temperature of the environment. In particular, in the case where an interval between the projected structures penetrating the insulating resin is large, as is in the conventional structure stated above, the insulating resin is easy to peel from the semiconductor device between the projected structures. And, in the case where the insulating resin peels from the semiconductor device, adhesion between the projected structure and the semiconductor device is decreased; and as a result, there is a fear that the connection reliability between the projected structure and the semiconductor device is decreased.

SUMMARY OF THE INVENTION

The present invention has been made in view of these situations, and a general purpose of the invention is to provide a technique in which further miniaturization of a semiconductor module can be achieved as well as reduction in the number of the production processes. Another purpose of the invention is to provide a technique in which the connection reliability between a projected structure and an electrode of a semiconductor device can be improved in the structure in which the two are connected to each other.

In order to solve the above-mentioned problems, an embodiment of the present invention is a substrate for mounting a device. The substrate for mounting a device comprises: an insulating resin layer; a wiring layer provided on one major surface of the insulating resin layer; a projected electrode that is connected to the wiring layer electrically and that projects toward the insulating resin layer from the wiring layer; and a metal member at least part of which is embedded in the insulating resin layer, wherein an embedded depth of the metal member is shallower than a projected length of the projected electrode.

In order to solve the above-mentioned problems, an embodiment of the present invention is a substrate for mounting a device. The substrate for mounting a device comprises: an insulating resin layer formed by an insulating resin; a wiring layer provided on one major surface of the insulating resin layer; a plurality of projected electrodes that are connected to the wiring layer electrically, and that project toward the insulating resin layer from the wiring layer; and a counter electrode that is provided at a position corresponding to each of the plurality of projected electrodes, on the other major surface of the insulating resin layer, and that has a counterface facing the top face of the projected electrode, wherein, among the plurality of projected electrodes, a projected length of part of the plurality of projected electrodes is smaller than that of the other projected electrodes, and wherein the part of the plurality of projected electrodes and the counter electrodes corresponding thereto are capacitively-coupled, and wherein the other projected electrodes and the counter electrodes corresponding thereto are connected electrically.

Still another embodiment of the present invention is a method for producing a substrate for mounting a device. The method for producing a substrate for mounting a device comprises: preparing a metal plate on which a plurality of projected electrodes are provided so as to project; adjusting, among the plurality of projected electrodes, a projected length of part of the plurality of projected electrodes so as to be smaller than that of the other projected electrodes; connecting the part of projected electrodes and the counter electrodes corresponding thereto in a way that the two are capacitively-coupled, and connecting the other projected electrodes and the counter electrodes corresponding thereto in a way that the two are connected electrically, after the metal plate is arranged on one major surface of the insulating resin layer such that the projected electrodes face the insulating resin layer side, while the other projected electrodes are exposed from the other major surface of the insulating resin layer, and a counter electrode having a counterface that faces the top face of the projected electrode is arranged at a position corresponding to each of the plurality of projected electrodes, on the other major surface the insulating resin layer; and removing selectively the metal plate to form the wiring layer.

Still another embodiment of the present invention is a method for producing a semiconductor module. The method for producing a semiconductor module comprises mounting a semiconductor device on the substrate for mounting a device produced by the method for producing a substrate for mounting a device according to any one of embodiments stated above.

Still another embodiment of the present invention is also a method for producing a semiconductor module. The method for producing a semiconductor module comprises: preparing a metal plate on which a plurality of projected electrodes are provided so as to project; adjusting, among the plurality of projected electrodes, a projected length of part of the plurality of projected electrodes so as to be smaller than that of the other projected electrodes; connecting the part of the projected electrodes and device electrodes corresponding thereto in a way that the two are capatively-coupled, and connecting the other projected electrodes and the device electrodes corresponding thereto in a way that the two are connected electrically, after the metal plate is arranged on one major surface of the insulating layer such that the projected electrodes face the insulating resin layer side, while the other projected electrodes are exposed from the other major surface of the insulating resin layer, and a semiconductor device provided with the device electrode corresponding to the projected electrode is arranged on the other major surface of the insulating resin layer; and removing selectively the metal plate to form the wiring layer.

In order to solve the above-mentioned problems, an embodiment of the present invention is a substrate for mounting a device. The substrate for mounting a device comprises: an insulating resin layer; a wiring layer provided on one major surface of the insulating resin layer; a projected electrode that is connected to the wiring layer electrically and projects toward the insulating resin layer from the wiring layer; and a backing member at least part of which is embedded in the insulating resin layer, and that is used for backing up the insulating resin layer.

Other embodiment of the present invention is a semiconductor module. The semiconductor module comprises: the substrate for mounting a device according to any one of embodiments stated above; and a semiconductor device provided with a device electrode facing the projected electrode, wherein the projected electrode penetrates the insulating resin layer to be connected to the device electrode electrically.

Still another embodiment of the present invention is a portable apparatus. On the portable apparatus, the semiconductor module according to any one of embodiments stated above is mounted.

DETAILED DESCRIPTION OF THE INVENTION

Figure 1:
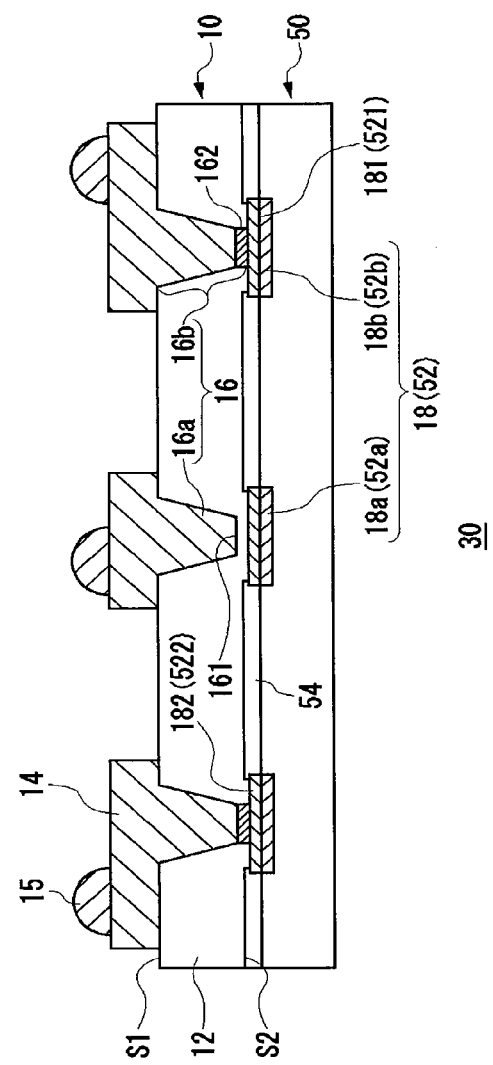
FIG. 1 is a schematic cross-sectional diagram illustrating a structure of a substrate for mounting a device and a semiconductor module according to Embodiment 1.

The invention will now be described by reference to the preferred embodiments. This does not intend to limit the scope of the present invention, but to exemplify the invention.

Hereinafter, the present invention will now be described based on the preferred embodiments with reference to accompanying drawings. The same or like components, members, or processes illustrated in each drawing are denoted by the same reference numerals, and the duplicative descriptions will be appropriately omitted. The embodiments are not intended to limit the invention but to serve as particular examples thereof, and all features or combinations thereof described there are not always essential to the present invention.

Embodiment 1

FIG. 1 is a schematic cross-sectional diagram illustrating a structure of a substrate 10 for mounting a device and a semiconductor module 30 using the same according to Embodiment 1. The semiconductor module 30 comprises the substrate 10 for mounting a device and a semiconductor device 50 mounted thereon.

The substrate 10 for mounting a device comprises: an insulating resin layer 12 formed by an insulating resin; a wiring layer 14 provided on one major surface S1 of the insulating resin layer 12; and a plurality of projected electrodes 16 that are connected to the wiring layer electrically, and that project toward the insulating resin layer 12 from the wiring layer 14. The substrate 10 for mounting a device is provided with a counter electrode 18 that is provided at a position corresponding to each of the plurality of projected electrodes 16 on the other major surface S2 of the insulating resin layer 12, and that has a counterface 181 facing the top face 161 of the projected electrode 16.

The insulating resin layer 12 is made of an insulating resin and formed with a material that induces a plastic flow when, for example, pressurized. An example of a material that induces a plastic flow when pressurized includes an epoxy-based thermosetting resin. As an epoxy-based thermosetting resin used for the insulating resin layer 12, a material may be used as far as the material has a viscosity property of, for example, 1 kPa·s under the condition of a temperature of 160° C. and a pressure of 8 Mpa. When pressurized with a pressure of, for example, 5 to 15 Mpa under the condition of a temperature of 160° C., the epoxy-based thermosetting resin reduces its viscosity to ⅛th-fold in comparison to that when not pressurized. On the other hand, the epoxy resin in the B-stage before thermosetting is less viscous in the same level as that when not pressurized, and not viscous even when pressurized, under the condition of the glass transition temperature Tg or less. The epoxy-based thermosetting resin is a dielectric material with a dielectric constant of about 3 to 4.

The wiring layer 14 is provided on one major surface S1 of the insulating resin layer 12, and is formed with a conductive material, preferably a rolled metal, further preferably a rolled copper. A plurality of projected electrodes 16 are provided so as to project on the surface of the wiring layer 14 on the side of the insulating resin layer 12. In the present embodiment, the wiring layer 14 and the projected electrodes 16 are formed into one body, but they are not particularly limited thereto. On the major surface of the wiring layer 14 opposite to the insulating resin layer 12, solder bumps 15 are formed at certain positions. The positions where the solder bumps 15 are formed are ones where the wiring is put around, for example, in rewiring.

The projected electrode 16 has, for example, a rounded shape when seen in planar view, and has a side face formed such that the diameter thereof becomes progressively smaller toward the top of the electrode. The shape of the projected electrode 16 is not particularly limited to, and, for example, a cylindrical shape having a certain diameter is also possible. A polygonal shape such as a quadrangle when seen in planar view is also possible. Herein, among the plurality of projected electrodes 16, a projected length (height or embedded depth) of part of the projected electrodes 16a (metal material) from the wiring layer 14 is smaller (shallower) than that of the other projected electrodes 16b from the wiring layer 14.

That is, in the present embodiment, the projected electrode 16b is composed of a metal layer 162 covering the top face 161 of the projected electrode 16b and the portion projecting from the wiring layer 14; hence, the projected length of the projected electrode 16a is smaller than that of the projected electrode 16b. The metal layer 162 is a metal plated layer formed by an electrolytic plating process using a metal, for example, gold (Au), or by a non-electrolytic plating process; or a conductive paste layer formed by using a conductive paste. In the present embodiment, the metal layer 162 is structured by a Ni/Au plated layer that is made of gold (Au) and nickel (Ni). Alternatively, the projected length of the projected electrodes 16a can also be made smaller than that of the other projected electrodes 16b by removing the top portions of the part of the projected electrodes 16a by etching, etc.

The counter electrode 18 is made of a metal such as copper (Cu) and aluminum (Al). The counter electrodes 18 are provided at the positions corresponding to each of the plurality of projected electrodes 16 on the other major surface S2 of the insulating resin layer 12. Because the projected length of the projected electrode 16a is smaller than that of the projected electrode 16b, the insulating resin layer 12 lies between the projected electrode 16a and the counter electrode 18a corresponding thereto. Therefore, the projected electrode 16a and the counter electrode 18a are capacitively-coupled to constitute a capacitor. On the other hand, the projected electrode 16b having the projected length larger than that of the projected electrode 16a, and the counter electrode 18b corresponding thereto are in contact with each other to be connected electrically (ohmic contact). In the present embodiment, a metal layer 182 made of Ni/Au is provided on a counterface 181 of the counter electrode 18. Due to this, the projected electrode 16b and the counter electrode 18b are connected by an Au—Au contact, allowing the connection reliability between the projected electrode 16b and the counter electrode 18b to be improved.

In the present embodiment, the counter electrode 18 is a device electrode 52 of the semiconductor device 50. The device electrodes 52a and 52b corresponding to each of the projected electrodes 16a and 16b are provided on the semiconductor device 50. A protecting layer 54 is stacked on the major surface of the semiconductor device 50 on the side where the device 50 is in contact with the insulating resin layer 12, such that the device electrode 52 is opened. Specific example of the semiconductor device 50 includes a semiconductor chip such as an integrated circuit (IC) and a large-scale IC (LSI) or the like. Specific example of the protecting layer 54 includes a polyimide layer. The present embodiment illustrates an example in which the counter electrode 18 is the device electrode 52 of the semiconductor device 50, but the semiconductor device 50 may also be implemented at any position of the substrate 10 for mounting a device by any process such as wire bonding.

In the present embodiment, the insulating resin layer 12 is provided between the substrate 10 for mounting a device and the semiconductor device 50, and the substrate 10 for mounting a device is pressure-bonded to one major surface S1 of the insulating resin layer 12, and the semiconductor device 50 is pressure-bonded to the other major surface thereof. The projected electrode 16b penetrates the insulating resin layer 12 to be connected electrically to the counter electrode 18b, that is, the device electrode 52b provided in the semiconductor device 50. Because the insulating resin layer 12 is made of a material that induces a plastic flow when pressurized, it can be prevented that a residual layer of the insulating resin layer 12 lies between the projected electrode 16b and the device electrode 52b, in the state where the substrate 10 for mounting a device, the insulating resin layer 12, and the semiconductor device 50 are formed into one body in this order; hence the connection reliability can be improved.

(Method for Producing Substrate for Mounting Device and Semiconductor Module)

FIGS. 2A to 2D are cross-sectional diagrams illustrating a method for forming the projected electrode 16.

Figure 2A:
FIGS. 2A to 2D are cross-sectional diagrams illustrating a method for forming a projected electrode.

As illustrated in FIG. 2A, a copper plate 13 having a thickness larger than at least a total of the height of the projected electrode 16 and the thickness of the wiring layer 14, is prepared.

Figure 2B:
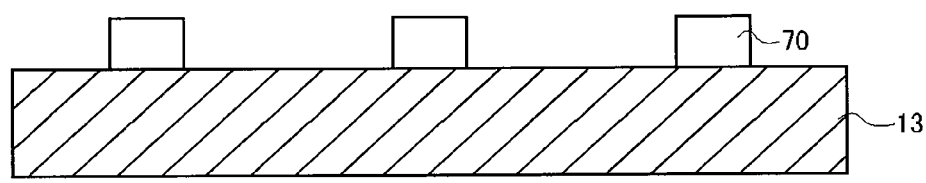

As illustrated in FIG. 2B, resists 70 are subsequently formed selectively in accordance with the pattern of the projected electrodes 16 by a lithography process.

Figure 2C:
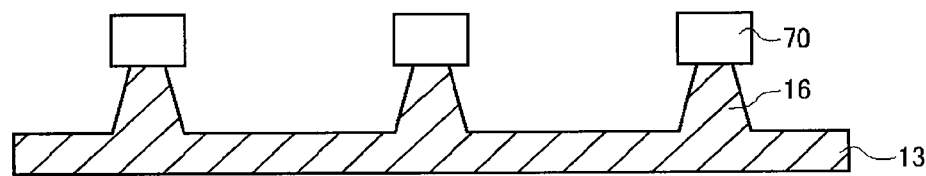

As illustrated in FIG. 2C, a certain pattern of the projected electrodes 16 is then formed on the copper plate 13 by using the resist 70 as a mask.

Figure 2D:
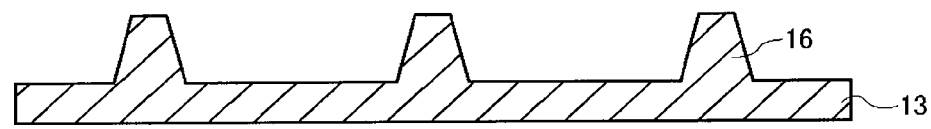

As illustrated in FIG. 2D, the resist 70 is subsequently removed. By the process stated above, the projected electrodes 16 are formed.

In the projected electrode 16 of the present embodiment, the diameter in the base portion, the diameter in the tip portion, and the height thereof are, for example, 100 µmϕ, 50 µmϕ, and 40 µm, respectively.

FIGS. 3A to 3D and FIGS. 4A to 4C are cross-sectional diagrams illustrating a method for connecting the projected electrode 16 and the counter electrode 18 or the device electrode 52.

Figure 3A:
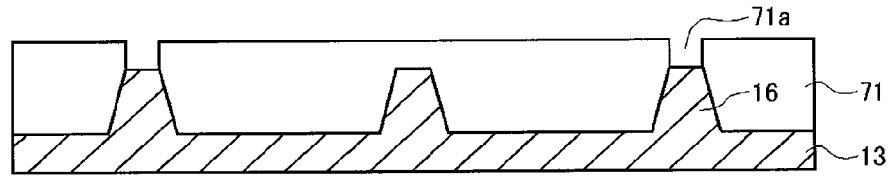
FIGS. 3A to 3D are cross-sectional diagrams illustrating a method for connecting a projected electrode and a counter electrode or a device electrode.

As illustrated in FIG. 3A, a resist 71 is stacked on the major surface of the copper plate 13 on the side where a plurality of projected electrodes 16 are formed, by a lithography process, and opening portions 71a are provided at positions corresponding to the certain projected electrodes 16.

Figure 3B:
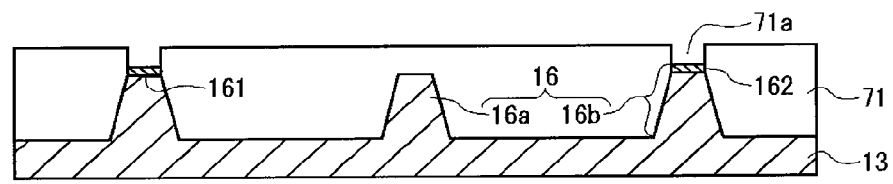

As illustrated in FIG. 3B, the metal layers 162 are formed on top faces 161 of the projected electrodes 16 exposed at the opening portions 71a. The metal layers 162 are formed as metal layers made of Ni/Au by, for example, an electrolytic plating process or a non-electrolytic plating process. With this, the projected length of the projected electrode 16a from the copper plate 13, the metal layer 162 not being formed on the projected electrode 16a, is made smaller than that of the projected electrode 16b including the metal layer 162 from the copper plate 13. The metal layer 162 is formed such that the Ni layer is in contact with the projected electrode 16 and the Au layer in contact with the counter electrode 18. A method for forming the metal layer 162 is not particularly limited thereto, but may also be formed by using a conductive paste such as an Au paste. The thickness of the metal layer 162 is, for example, about 1.25 to 3.25 µm, 0.25 µm of which being the thickness of the Au layer and 1 to 3 µm of which being the thickness of the Ni layer.

Figure 3C:
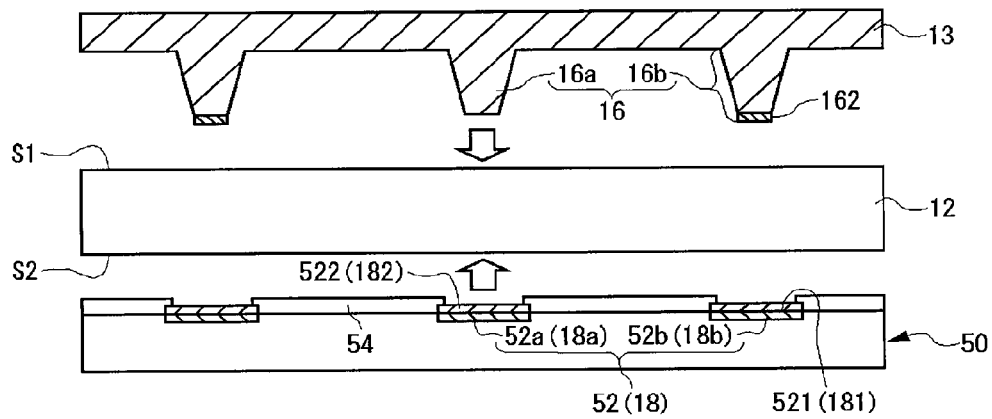

As illustrated in FIG. 3C, the resist 71 is subsequently removed. The copper plate 13 is then arranged on one major surface S1 of the insulating resin layer 12 such that the projected electrodes 16 face the insulating resin layer 12 side. The counter electrode 18 having a counterface 181 that faces the top face 161 of the projected electrode 16, is arranged at a position corresponding to each of the projected electrodes 16 on the other major surface S2 of the insulating resin layer 12. The thickness of the insulating resin layer 12 is about the height of the projected electrode 16b, that is, about 23 µm. On the counterface 181 of the counter electrode 18, the Ni/Au metal layer 182 is formed in the same way as with the projected electrode 16b.

Figure 3D:
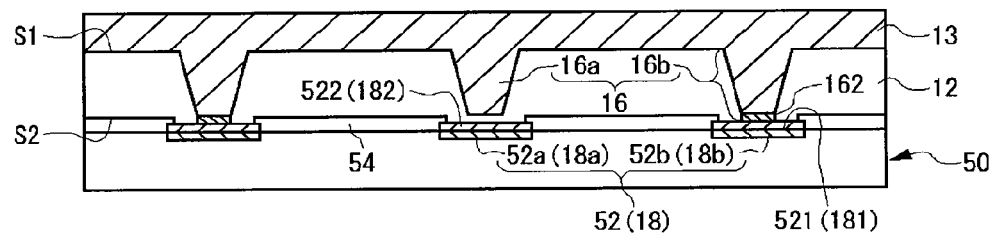

As illustrated in FIG. 3D, the projected electrode 16b is then exposed from the other major surface S2 of the insulating resin layer 12 such that the projected electrode 16a and the counter electrode 18a corresponding thereto are capacitively-coupled, and the projected electrode 16b and the counter electrode 18b corresponding thereto are connected electrically. Because the projected length of the projected electrode 16a is smaller than that of the projected electrode 16b by the thickness of the metal layer 162, the insulating resin layer 12 with a thickness similar to that of the metal layer 162, lies between the projected electrode 16a and the counter electrode 18a, in the state where the projected electrode 16b is engaged with the counter electrode 18b. Due to this, the projected electrode 16a and the counter electrode 18a are capacitively-coupled to form a capacitor as a passive device. The capacitor can be changed in its capacity arbitrarily by adjusting the material of the insulating resin layer 12, and the thickness of the insulating resin layer 12 lying between the projected electrode 16a and the counter electrode 18a, that is, the thickness of the metal layer 162. On the top face 161 of the projected electrode 16b and on the counterface 181 of the counter electrode 18b, the Ni/Au metal layer 162 and the metal layer 182 are formed, respectively; and the projected electrode 16b and the counter electrode 18b are connected electrically by an Au—Au contact. Therefore, the connection reliability between the projected electrode 16b and the counter electrode 18b can be improved. It is also possible that the projected electrode 16b and the counter electrode 18b are not provided with metal layers. In the case, the projected length of the part of the projected electrodes 16a can be made smaller than that of the other projected electrodes 16b, by removing part of the top portions of the projected electrodes 16a with etching. In the case, a capacity of the capacitor can be changed arbitrarily by adjusting an amount of the part of the top portions to be removed of the projected electrode 16a.

In the present embodiment, the semiconductor device 50 in which the device electrode 52 corresponding to the projected electrode 16 is provided, is arranged on the other major surface S2 of the insulating resin layer 12. In the case, the device electrode 52 corresponds to the counter electrode 18. The copper plate 13, the insulating resin layer 12, and the semiconductor device 50 are formed into one body by pressure-bonding the copper plate 13 and the semiconductor device 50 by using a press machine via the insulating resin layer 12. With this, the projected electrode 16a and the device electrode 52a are capacitively-coupled, and the projected electrode 16b and the device electrode 52b are connected electrically. The pressure and temperature in the press working are about 5 Mpa and 200° C., respectively. With the press working, the insulating resin layer 12 induces a plastic flow so that the projected electrode 16 penetrates the insulating resin layer 12. Then, the metal layer 162 of the projected electrode 16b and that 522 of the device electrode 52b are pressure-bonded such that the projected electrode 16b and the device electrode 52b are connected electrically. Because the projected electrode 16 has a shape in which the whole shape of the electrode becomes progressively thinner toward the tip thereof, the projected electrode 16 smoothly penetrates the insulating resin layer 12.

Figure 4A:
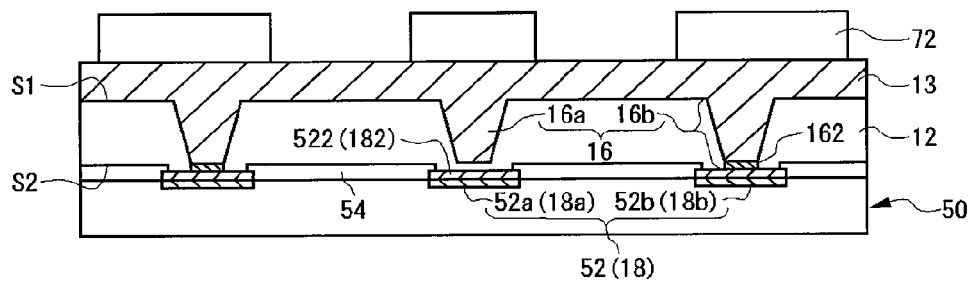
FIGS. 4A to 4C are cross-sectional diagrams illustrating a method for connecting the projected electrode and the counter electrode or the device electrode.

As illustrated in FIG. 4A, resists 72 are subsequently formed selectively in accordance with the pattern of the wiring layer 14 by a lithography process. Specifically, resist 72 are formed selectively on the copper plate 13 in the following process: a resist film with a certain thickness is attached to the copper plate 13 by using a laminating apparatus, and exposed by using a photomask with the pattern of the wiring layer 14; and the resist film is then developed with the use of an $Na_2CO_3$ solution, and the resists in unexposed regions are removed. In order to improve the adhesion property with the resist, it is preferable that the surface of the copper plate 13 is subjected to a pretreatment such as grinding and washing or the like, before laminating the resist film, if needed. Alternatively, the copper plate 13 may also be adjusted so as to have a thickness similar to that of the wiring layer 14 by etching the whole face of the copper plate 13 opposite to the surface where the projected electrodes 16 are formed, before laminating the resist 72, if needed.

Figure 4B:
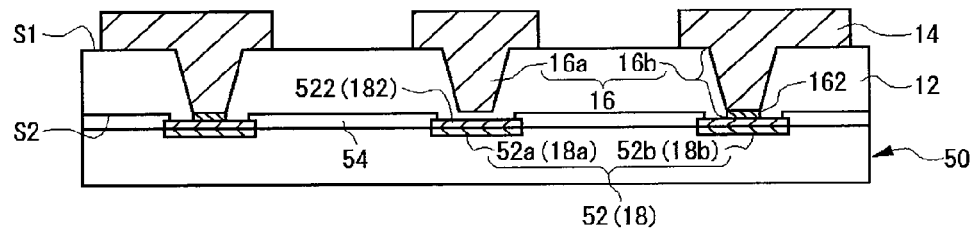

As illustrated in FIG. 4B, the wiring layer 14 with a certain wiring pattern is then formed by etching the copper plate 13 with the use of a ferric chloride solution by using the resists 72 as masks. Thereafter, the resist is peeled off by using a parting agent such as NaOH solution. In the present embodiment, the thickness of the wiring layer 14 is about 15 μm.

Figure 4C:
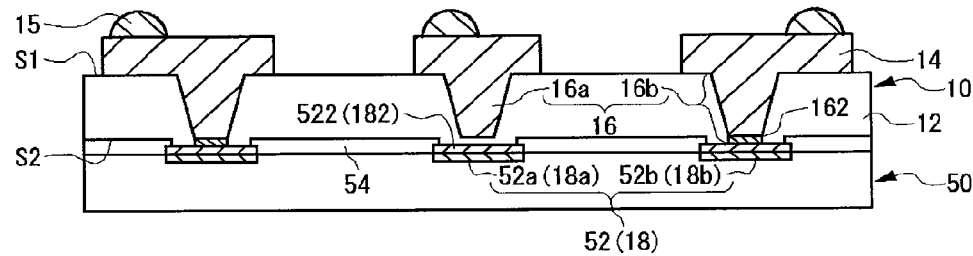

As illustrated in FIG. 4C, solder bumps 15 are formed at certain positions of the wiring layer 14. The positions where the solder bumps are formed are ones where the wiring is put around, for example, in rewiring.

The substrate 10 for mounting a device is formed by the production process described above. Or, when the semiconductor device 50 is pressure-bonded via the insulating resin layer 12, and the counter electrode 18 is used as the device electrode 52, the semiconductor module 30 is obtained.

In the present embodiment as stated above, among a plurality of projected electrodes 16 provided on the wiring layer 14, part of the projected electrodes 16a are capacitively-coupled with the counter electrodes 18a or the device electrodes 52a; and the other projected electrodes 16b are connected to the counter electrodes 18b or the device electrodes 52b electrically. Therefore, it is not necessary to mount a capacitor, a passive device, on the substrate 10 for mounting a device as a separate part; hence, the semiconductor module 30 can be miniaturized. In addition, the projected electrode 16a and the counter electrode 18a or the device electrode 52a are capacitively-coupled to form a capacitor at a same time when the projected electrode 16b provided on the wiring layer 14 so as to project, and the counter electrode 18b or the device electrode 52 are connected electrically to form a rewiring. Therefore, the number of the production processes can be reduced in comparison to the case where a capacitor is mounted on the substrate 10 for mounting a device as a separate part; hence, the production processes can be simplified and the production cost can be reduced. Moreover, because a capacitor is formed by capacitively-coupling the projected electrode 16a that is to be inserted into the insulating resin layer 12, and the counter electrode 18a or the device electrode 52a, an interval between the electrodes can be small; hence, a capacity of the capacitor can be large. In addition, the capacitor can be changed in its capacity arbitrarily by adjusting the material of the insulating resin layer 12, and the thickness of the insulating resin layer 12 lying between the projected electrode 16a and the counter electrode 18a.

Embodiment 2

In the above Embodiment 1, the substrate 10 for mounting a device or the semiconductor module 30 is formed by subjecting the copper plate 13 and the counter electrode 18 or the semiconductor device 50 to pressure molding with the insulating resin layer 12 sandwiched between the two such that they are formed into one body; however, the substrate 10 for mounting a device or the semiconductor module 30 may also be formed in the following process. Hereinafter, the present embodiment will be described. It is noted that the projected electrode 16 is formed in the same way as with Embodiment 1, and the same structure as in Embodiment 1 is denoted with the same reference numeral as in Embodiment 1, and the description with respect thereto is omitted.

FIGS. 5A to 5F and FIGS. 6A to 6C are cross-sectional diagrams illustrating a method for connecting the projected electrode 16 and the counter electrode 18 or the device electrode 52.

Figure 5A:
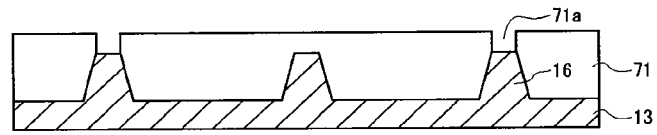
FIGS. 5A to 5F are cross-sectional diagrams illustrating a method for connecting the projected electrode and the counter electrode or the device electrode according to Embodiment 2.

As illustrated in FIG. 5A, a resist 71 is stacked on the major surface of the copper plate 13 on the side where a plurality of projected electrodes 16 are formed, by a lithography process, and opening portions 71a are provided at positions corresponding to certain projected electrodes 16.

Figure 5B:
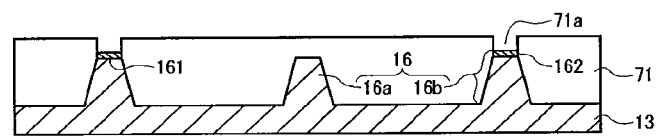

As illustrated in FIG. 5B, metal layers 162 are then formed on the top faces 161 of the projected electrodes 16 exposed from the opening portions 71a. Due to this, a projected length of the projected electrode 16a from the copper plate 13, the metal layer 162 being not formed on the top face of the electrode 16a, is made smaller than that of the projected electrodes 16b including the metal layers 162, from the copper plate 13.

Figure 5C:
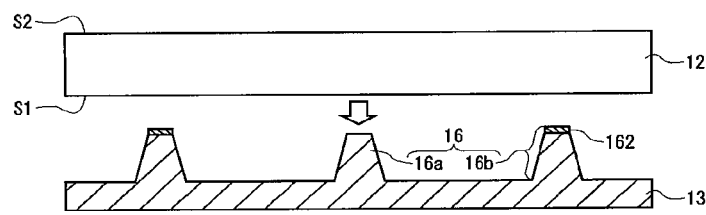

As illustrated in FIG. 5C, the resist 71 is subsequently removed, and the copper plate 13 is arranged on one major surface S1 of the insulating resin layer 12 such that the insulating resin layer 12 is pressure-bonded to the major surface of the copper plate 13 where the projected electrodes 16 are formed.

Figure 5D:

As illustrated in FIG. 5D, the other major surface S2 of the insulating resin layer 12 opposite to the surface to which the copper plate 13 is pressure-bonded, is etched to expose the metal layers 162 of the projected electrodes 16b.

Figure 5E:
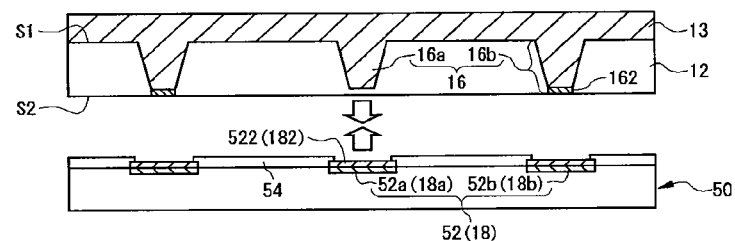
Figure 5F:
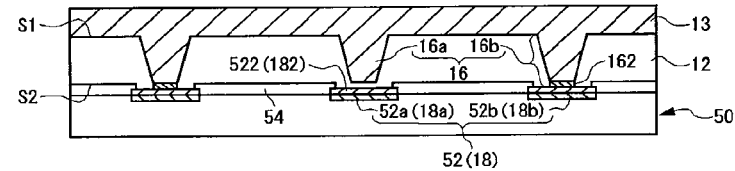

As illustrated in FIG. 5E, the semiconductor device 50 is then arranged on the other major surface S2 of the insulating resin layer 12; and the copper plate 13, the insulating resin layer 12, and the semiconductor device 50 are formed into one body by pressure-bonding the copper plate 13 pressure-bonded to the insulating resin layer 12, and the semiconductor device 50, as illustrated in FIG. 5F. Due to this, the projected electrode 16a and the device electrode 52a are capacitively-coupled, and the projected electrode 16b and the device electrode 52b are connected electrically.

Figure 6A:
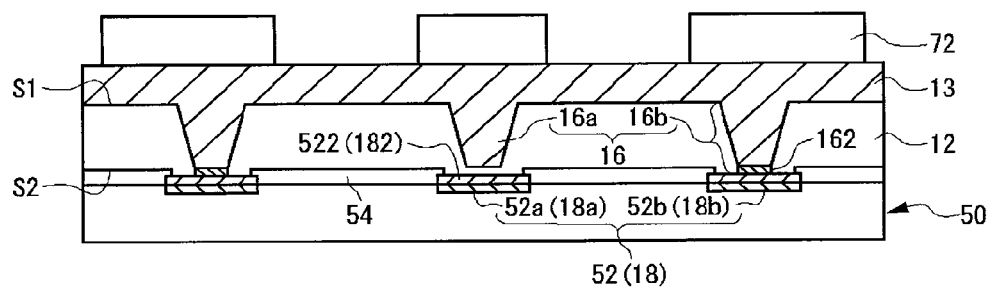
FIGS. 6A to 6C are cross-sectional diagrams illustrating a method for connecting the projected electrode and the counter electrode or the device electrode.

As illustrated in FIG. 6A, resists 72 are then formed selectively in accordance with the pattern of the wiring layer 14, by a lithography process.

Figure 6B:
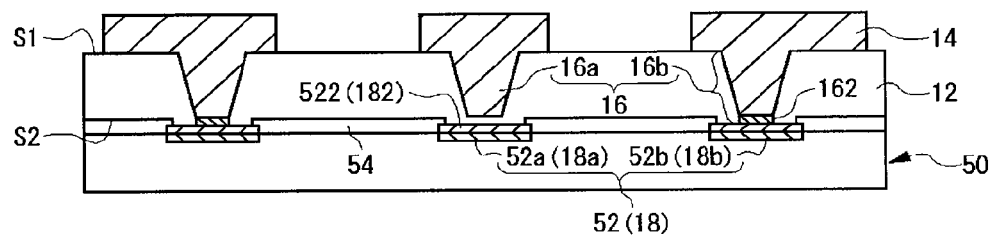

As illustrated in FIG. 6B, a certain pattern of the wiring layer 14 is then formed by etching the copper plate 13 with the use of the resists 72 as masks, followed by removal of the resists 72.

Figure 6C:
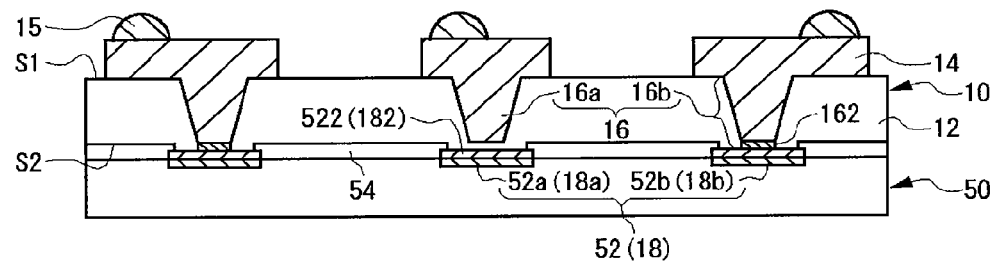

As illustrated in FIG. 6C, solder bumps are formed at certain positions of the wiring layer 14.

The semiconductor module 30 is formed by the production process described above. Also, a counter electrode 18 may be used instead of the device electrode 50, and in the case, the substrate 10 for mounting a device is obtained by the above process.

According to the present embodiment, the following advantages can be further obtained in addition to the above advantages of Embodiment 1. That is, in the present embodiment, the counter electrode 18 or the device electrode 50 is pressure-bonded to the insulating resin layer 12 after the metal layer 162 is exposed; hence, the projected electrode 16 and the counter electrode 18 or the device electrode 52 can be positioned accurately, allowing the connection reliability between the projected electrode 16b and the counter electrode 18b or the device electrode 52b to be improved. With this, the reliability of the substrate 10 for mounting a device or the semiconductor module 30 can be improved.

Embodiment 3

In the structures of the above Embodiments 1 and 2, the insulating resin layer 12 lies between the projected electrode 16a and the counter electrode 18a or the device electrode 52a; however, a dielectric film layer having a dielectric constant larger than that of the insulating resin layer 12 may be provided between the projected electrode 16a and the counter electrode 18a or the device electrode 52a, as illustrated in the present embodiment. Hereinafter, the present embodiment will be described. It is noted that the projected electrode 16 is formed in the same way as with Embodiment 1, and the same structure as in Embodiments 1 and 2 is denoted with the same reference numeral as in Embodiments 1 and 2, and the description with respect thereto is omitted.

FIGS. 7A to 7G and FIGS. 8A to 8E are cross-sectional diagrams illustrating a method for connecting the projected electrode 18 and the counter electrode 18 or the device electrode 52.

Figure 7A:
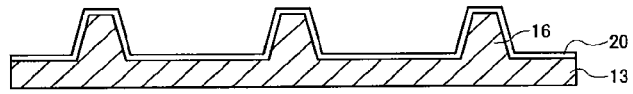
FIGS. 7A to 7G are cross-sectional diagrams illustrating a method for connecting a projected electrode and a counter electrode or a device electrode according to Embodiment 3.

As illustrated in FIG. 7A, a dielectric film 20 is formed on the whole major surface of the copper plate 13 on the side where a plurality of projected electrodes 16 are formed. The dielectric film 20 is formed as, for example, a silicon nitride (SiN) film by a plasma CVD process or the like. The SiN film has a dielectric constant of about 7.

Figure 7B:
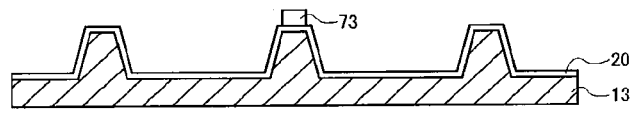

As illustrated in FIG. 7B, a resist 73 is then stacked on a position corresponding to the certain projected electrode 16 on the dielectric film 20, by a lithography process.

Figure 7C:

As illustrated in FIG. 7C, the dielectric film 20 is etched with the use of the resist 73 as a mask to form a dielectric film layer 22 on the top face 161 of the certain projected electrode 16.

Figure 7D:
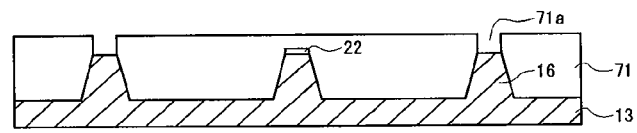

As illustrated in FIG. 7D, a resist 71 is then stacked on the major surface of the copper plate 13 on the side where the plurality of projected electrodes 16 are formed, by a lithography process. Subsequently, opening portions 71a are provided at positions corresponding to the projected electrodes 16 on which the dielectric film layers 22 are not formed.

Figure 7E:

As illustrated in FIG. 7E, metal layers 162 are then formed on the top faces 161 of the projected electrodes 16 exposed at the opening portions 71a. With this, a projected length of the projected electrode 16a from the copper plate 13, the metal layer 162 being not formed on the projected electrode 16a, is made smaller than that of the projected electrode 16b including the metal layer 162 from the copper plate 13.

Figure 7F:
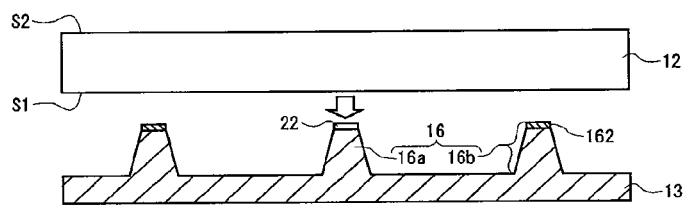

As illustrated in FIG. 7F, after the resist 71 is removed, the copper plate 13 is arranged on one major surface S1 of the insulating resin layer 12, and the insulating resin layer 12 is pressure-bonded to the major surface of the copper plate 13 on the side where the projected electrodes 16 are formed.

Figure 7G:
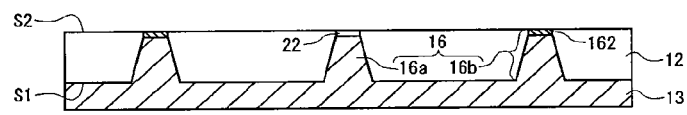

As illustrated in FIG. 7G, the other major surface S2 of the insulating resin layer 12 opposite to the major surface pressure-bonded to the copper plate 13, is etched such that the dielectric film layer 22 and the metal layer 162 are exposed.

Figure 8A:
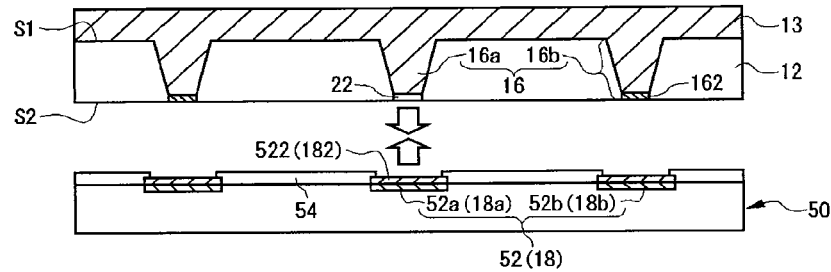
FIGS. 8A to 8E are cross-sectional diagrams illustrating a method for connecting the projected electrode and the counter electrode or the device electrode.
Figure 8B:
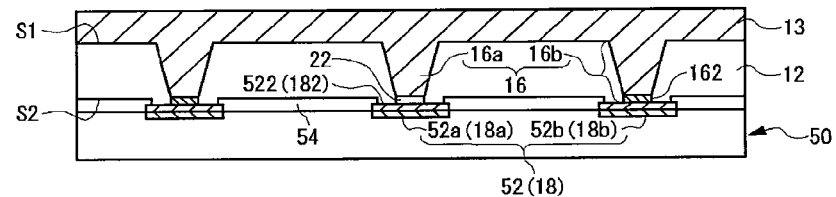

As illustrated in FIG. 8A, the semiconductor device 50 is arranged on the other major surface S2 of the insulating resin layer 12; and the copper plate 13 pressure-bonded to the insulating resin layer 12, and the semiconductor device 50 are pressure-bonded to form the copper plate 13, the insulating resin layer 12, and the semiconductor device 50 into one body, as illustrated in FIG. 8B. With this, the projected electrode 16a and the device electrode 52a are capacitively-coupled via the dielectric film layer 22, and the projected electrode 16b and the device electrode 52b are connected electrically.

Figure 8C:
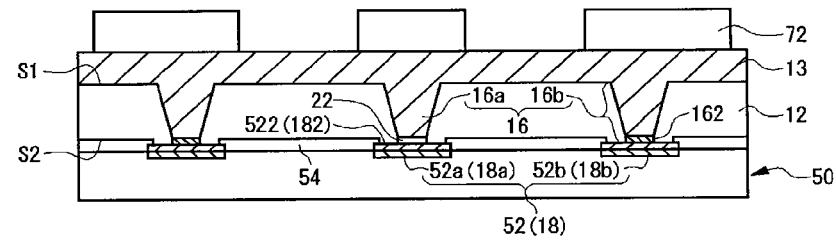

As illustrated in FIG. 8C, resists 72 are then formed selectively in accordance with the pattern of the wiring layer 14, by a lithography process.

Figure 8D:
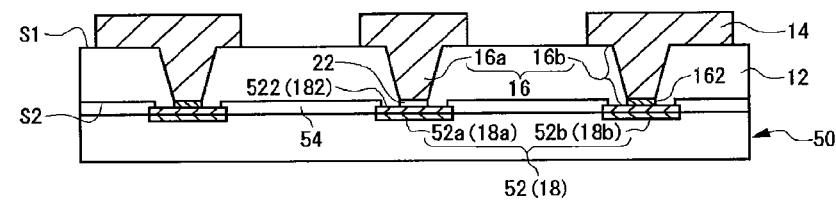

As illustrated in FIG. 8D, the wiring layer 14 with a certain wiring pattern is subsequently formed by etching the copper plate 13 with the use of the resists 72 as masks, followed by removal of the resists 72.

Figure 8E:
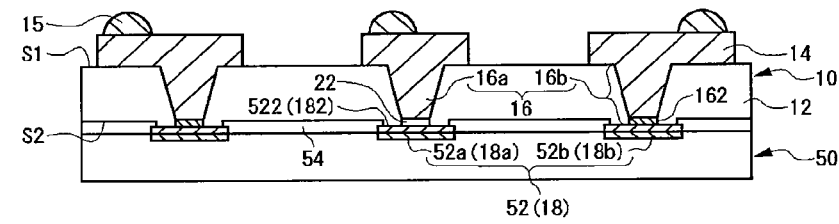

As illustrated in FIG. 8E, solder bumps are formed at certain positions of the wiring layer 14.

The semiconductor module 30 is formed by the production process described above. Also, the facing device 18 may be used instead of the device electrode 50, and in the case, the substrate 10 for mounting a device is obtained by the above process. In the present embodiment, the semiconductor device 50 is pressure-bonded after the insulating resin layer 12 is pressure-bonded to the copper plate 13 in the same way as with Embodiment 2; however, the copper plate 13 and the semiconductor device 50 may be pressure-bonded at an almost same time in the same way as with Embodiment 1, without being particularly limited thereto.

According to the present embodiment, the following advantages can be further obtained in addition to the above advantages of Embodiments 1 and 2. That is, in the present embodiment, the dielectric film layer 22 with a dielectric constant larger than that of the insulating resin layer 12 is provided between the projected electrode 16a and the counter electrode 18a or the device electrode 52a. And, the projected electrode 16a and the counter electrode 18a or the device electrode 18a are capacitively-coupled via the dielectric film layer 22. Due to this, a capacity of the capacitor formed by the projected electrode 16a and the counter electrode 18a or the device electrode 52a can be further increased.

Embodiment 4

In the present embodiment, an example of a structure is described in which the counter electrode 18 is part of other wiring layer provided on the other major surface S2 of the insulating resin layer 12. Hereinafter, the present embodiment will be described. It is noted that the projected electrode 16 is formed in the same way as with Embodiment 1, and the same structure as in Embodiments 1 to 3 is denoted with the same reference numeral as in Embodiments 1 to 3, and the description with respect thereto is omitted.

FIGS. 9A to 9G, FIGS. 10A to 10D, and FIGS. 11A and 11B are cross-sectional diagrams illustrating a method for connecting the projected electrode 16 and the counter electrode 18.

Figure 9A:
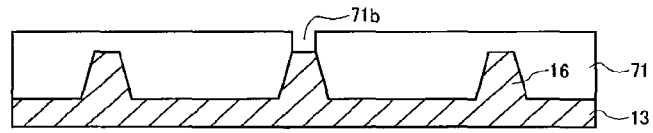
FIGS. 9A to 9G are cross-sectional diagrams illustrating a method for connecting a projected electrode and a counter electrode according to Embodiment 4.

As illustrated in FIG. 9A, a resist 71 is stacked on the major surface of the copper plate 13 on the side where a plurality of projected electrodes 16 are formed, by a lithography process, and an opening portion 71b is provided at a position corresponding to a certain projected electrode 16.

Figure 9B:

As illustrated in FIG. 9B, part of the projected electrode 16 exposed at the opening portion 71b is removed by etching the top portion thereof with the use of the resist 71 as a mask. Due to this, a projected length of the projected electrode 16a part of which is removed, from the copper plate 13 is made smaller than that of the other projected electrodes 16b, from the copper plate 13, followed by removal of the resist 71.

Figure 9C:
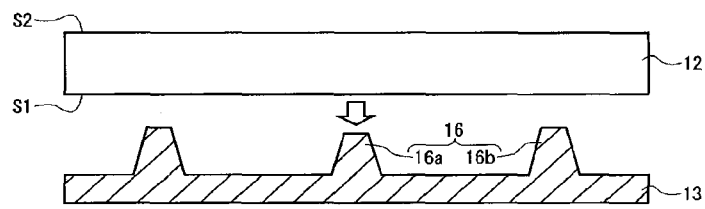

As illustrated in FIG. 9C, the copperplate 13 is then arranged on one major surface S1 side of the insulating resin layer 12 to pressure-bond the insulating resin layer 12 to the major surface of the copper plate 13 on the side where the projected electrodes 16 are formed.

Figure 9D:

As illustrated in FIG. 9D, the top faces 161 of the projected electrodes 16b are exposed by etching the other major surface S2 of the insulating resin layer 12 opposite to the major surface pressure-bonded to the copper plate 13.

Figure 9E:
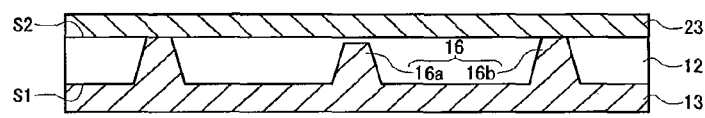

As illustrated in FIG. 9E, the copper plate 23 is subsequently stacked on the other major surface S2 of the insulating resin layer 12. The copper plate 23 is stacked by, for example, an electrolytic plating process or a non-electrolytic plating process. The thickness of the copper plate 23 is almost the same as that of the wiring layer 24.

Figure 9F:
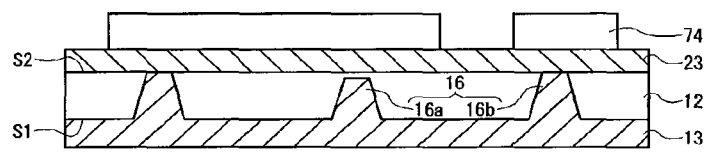

As illustrated in FIG. 9F, resists 74 are formed selectively in accordance with the pattern of the wiring layer 24, which is the other wiring layer, on the major surface of the copper plate 23 opposite to the insulating resin layer 12.

Figure 9G:

As illustrated in FIG. 9G, the wiring layer 24 with a certain wiring pattern is formed by etching the copper plate 23 with the use of the resists 74 as masks, followed by removal of the resists 74.

Figure 10A:
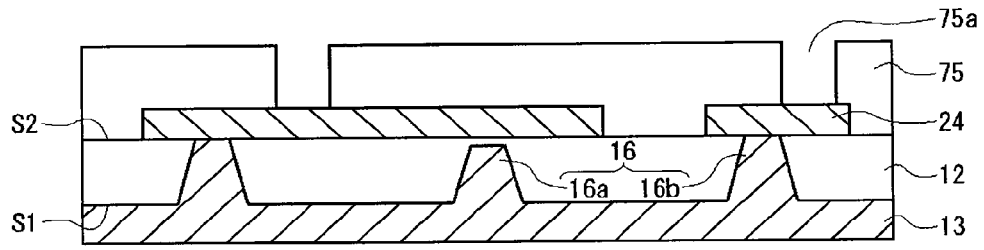
FIGS. 10A to 10D are cross-sectional diagrams illustrating a method for connecting the projected electrode and the counter electrode.

As illustrated in FIG. 10A, a resist 75 is then stacked on the major surface of the wiring layer 24 opposite to the insulating layer 12 by a lithography process, and opening portions 75a are provided at certain positions corresponding to the wiring layer 24.

Figure 10B:
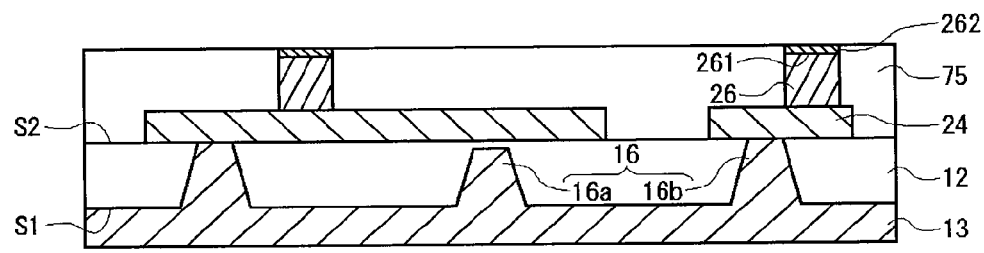

As illustrated in FIG. 10B, electrodes 26 are formed within the opening portions 75a. The electrodes 26 are formed by, for example, an electrolytic plating process or a non-electrolytic plating process. Thereafter, metal layers 262 are formed on the top faces 261 of the electrodes 26, followed by removal of the resist 75.

Figure 10C:
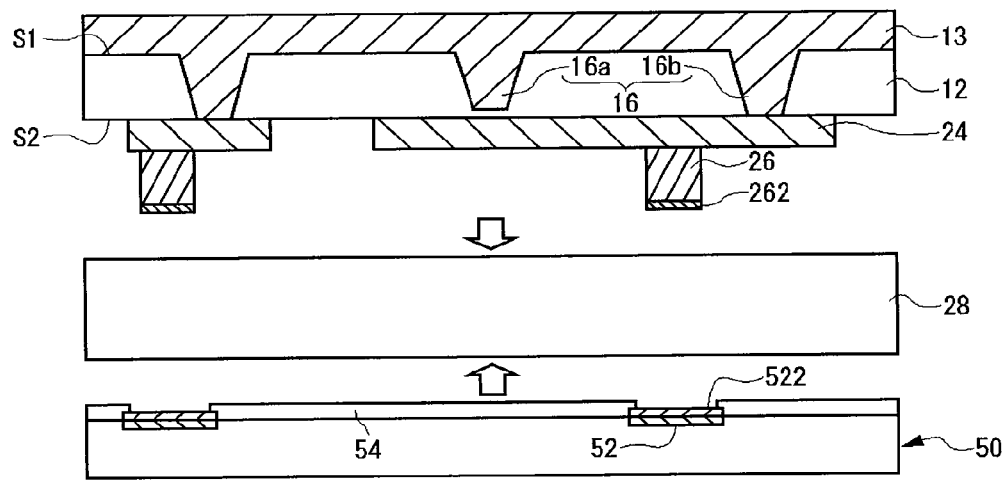
Figure 10D:
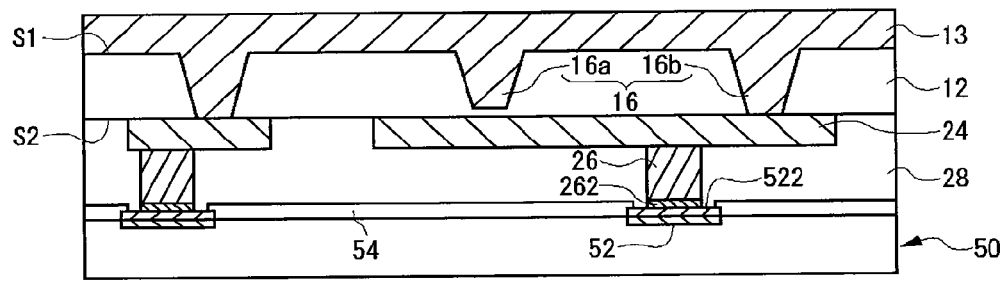

As illustrated in FIG. 10C, the semiconductor device 50 is arranged on one major surface of the insulating resin layer 28 made of the same material as with the insulating resin layer 12, and the copper plate 13 is arranged on the other major surface of the insulating resin layer 28 such that the electrodes 26 face the insulating resin layer 28 side. Then, as illustrated in FIG. 10D, the copper plate 13, the insulating resin layer 28, and the semiconductor device 50 are formed into one body by press-bonding the copper plate 13 and the semiconductor device 50 via the insulating resin layer 28.

Figure 11A:
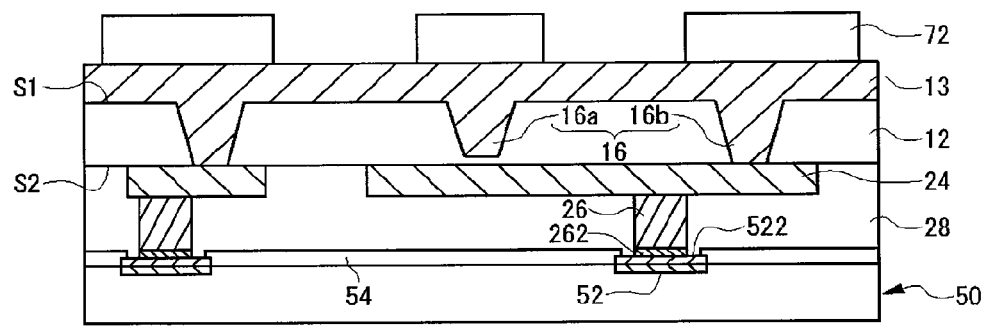
FIGS. 11A and 11B are cross-sectional diagrams illustrating a method for connecting the projected electrode and the counter electrode.

As illustrated in FIG. 11A, resists 72 are formed selectively in accordance with the pattern of the wiring layer 14 by a lithography process.

Figure 11B:
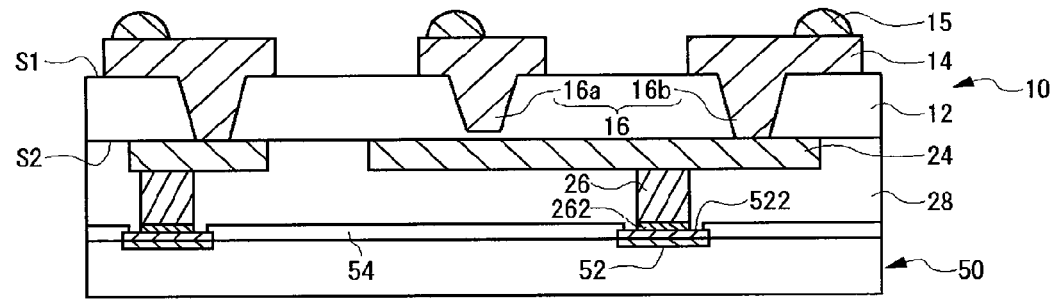

As illustrated in FIG. 11B, the wiring layer 14 with a certain wiring pattern is subsequently formed by etching the copper plate 13 with the use of the resists 72 as masks. The resists 72 are removed and solder bumps 15 are formed at certain positions of the wiring layer 14.

The semiconductor module 30 is formed by the production process described above. Or, when the semiconductor device 50 is not pressure-bonded, the substrate 10 for mounting a device is obtained.

In the present embodiment, capacitive coupling is formed between the projected electrode 16a provided on the wiring layer 14 and the wiring layer 24 provided on the other major surface S2 of the insulating resin layer 12. That is, the counter electrode 18 is part of the wiring layer 24 provided on the other major surface S2 of the insulating resin layer 12.

According to the present embodiment, the following advantages can be further obtained in addition to the above advantages of Embodiment 1. That is, as illustrated in the present embodiment, a capacitor can be formed between the projected electrode 16a and the wiring layer 24; hence, the substrate 10 for mounting a device having a multi-layer structure in which a capacitor is formed into one body, and the semiconductor module 30 using the same can be formed.

Embodiment 5

In the present embodiment, an example of a structure is described in which the counter electrode 18 is part of the other wiring layer provided on the other major surface S2 of the insulating resin layer 12, which is different from Embodiment 4 in the production process. Hereinafter, the present embodiment will be described. It is noted that the projected electrode 16 is formed in the same way as with Embodiment 1, and the same structure as in Embodiments 1 to 4 is denoted with the same reference numeral as in Embodiments 1 to 4, and the description with respect thereto is omitted.

FIGS. 12A to 12F, FIGS. 13A to 13E, and FIGS. 14A to 14C are cross-sectional diagrams illustrating a method for connecting the projected electrode 16 and the counter electrode 18.

Figure 12A:
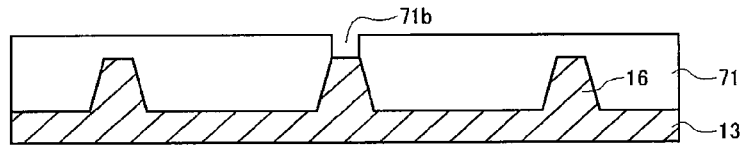
FIGS. 12A to 12F are cross-sectional diagrams illustrating a method for connecting a projected electrode and a counter electrode according to Embodiment 5.

As illustrated in FIG. 12A, a resist 71 is stacked on the major surface of the copper plate 13 on the side where a plurality of projected electrodes 16 are formed, by a lithography process, and an opening portion 71b is provided at a position corresponding to a certain projected electrode 16.

Figure 12B:

As illustrated in FIG. 12B, part of the projected electrode 16 exposed at the opening portion 71b is removed by etching the top portion thereof with the use of the resist 71 as a mask. Due to this, a projected length of the projected electrode 16a part of which is removed, from the copper plate 13 is made smaller than that of the other projected electrodes 16b, from the copper plate 13, followed by removal of the resist 71.

Figure 12C:
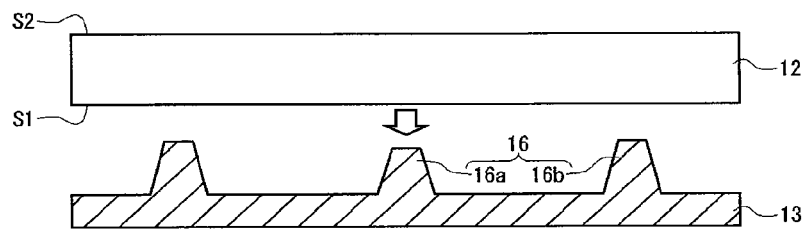

As illustrated in FIG. 12C, the copper plate 13 is then arranged on one major surface S1 side of the insulating resin layer 12 to pressure-bond the insulating resin layer 12 to the major surface of the copperplate 13 on the side where the projected electrodes 16 are formed.

Figure 12D:

As illustrated in FIG. 12D, the top faces 161 of the projected electrodes 16b are exposed by etching the other major surface S2 of the insulating resin layer 12 opposite to the major surface pressure-bonded to the copper plate 13.

Figure 12E:
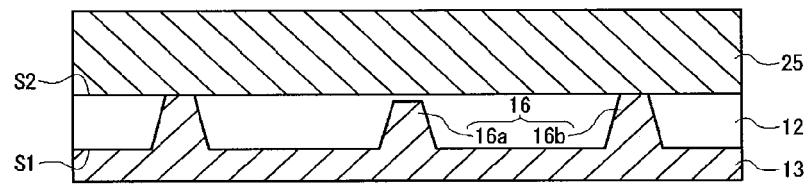

As illustrated in FIG. 12E, the copper plate 25 is subsequently stacked on the other major surface S2 of the insulating resin layer 12. The copper plate 25 is stacked by, for example, an electrolytic plating process or a non-electrolytic plating process. The thickness of the copper plate 25 is larger than at least the total of the thickness of the electrode 27 and the thickness of the wiring layer 24, the two being described later.

Figure 12F:
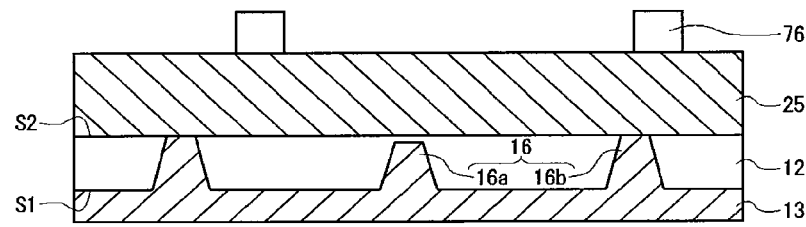

As illustrated in FIG. 12F, resists 76 are formed selectively in accordance with the pattern of the electrode 27 by a lithography process.

Figure 13A:
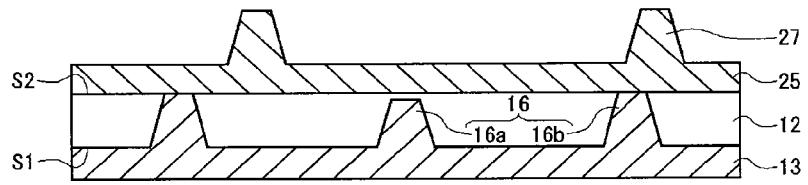
FIGS. 13A to 13E are cross-sectional diagrams illustrating a method for connecting the projected electrode and the counter electrode.

As illustrated in FIG. 13A, the electrode 27 with a certain pattern is formed on the copper plate 25 with the use of the resists 76 as masks.

Figure 13B:
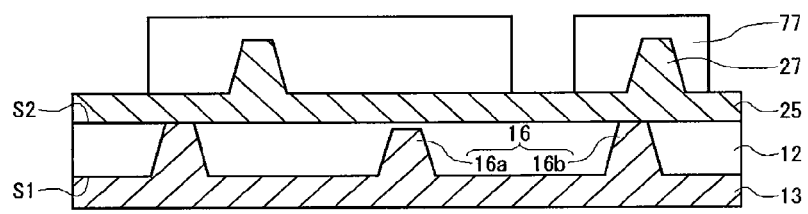

As illustrated in FIG. 13B, resists 77 are then formed selectively on the major surface of the copper plate 25 on the side opposite to the insulating resin layer 12, in accordance with the pattern of the wiring layer 24 that is the other wiring layer.

Figure 13C:
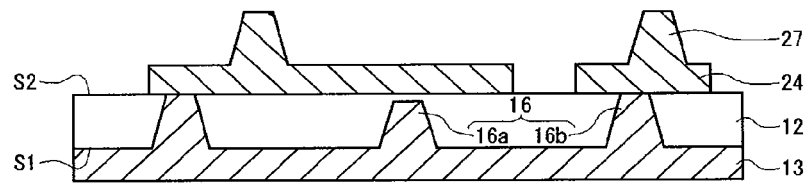

As illustrated in FIG. 13C, the wiring layer 24 with a certain wiring pattern is formed by etching the copper plate 25 with the use of the resists 77 as masks, followed by removal of the resists 77.

Figure 13D:
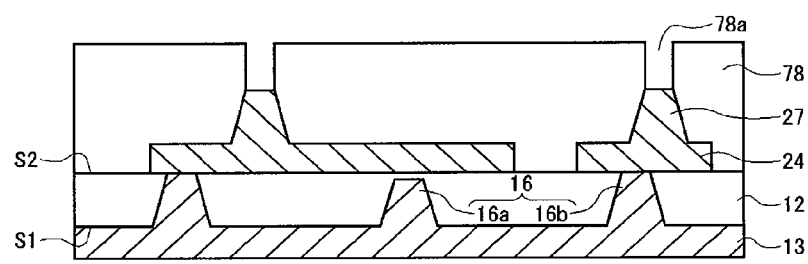

As illustrated in FIG. 13D, a resist 78 is then stacked on the major surface of the wiring layer 24 opposite to the insulating layer 12 by a lithography process, and opening portions 78a are provided at certain positions corresponding to the projected electrodes 27.

Figure 13E:
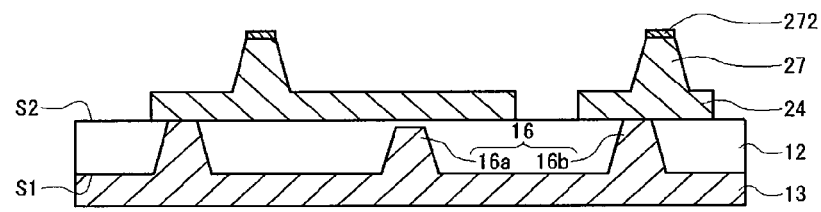

As illustrated in FIG. 13E, metal layers 272 are formed on the top faces of the electrodes 27 exposed at the opening portions 78a, followed by removal of the resist 78.

Figure 14A:
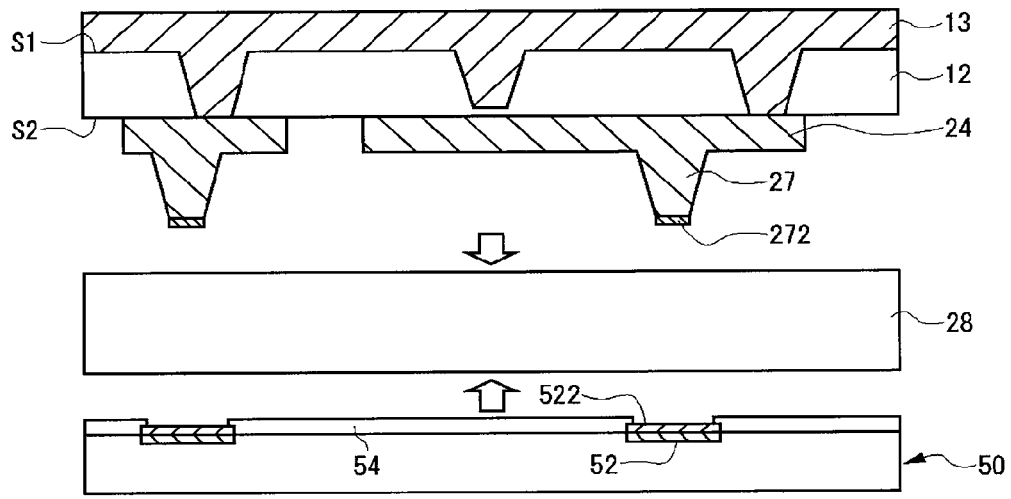
FIGS. 14A to 14C are cross-sectional diagrams illustrating a method for connecting the projected electrode and the counter electrode.
Figure 14B:
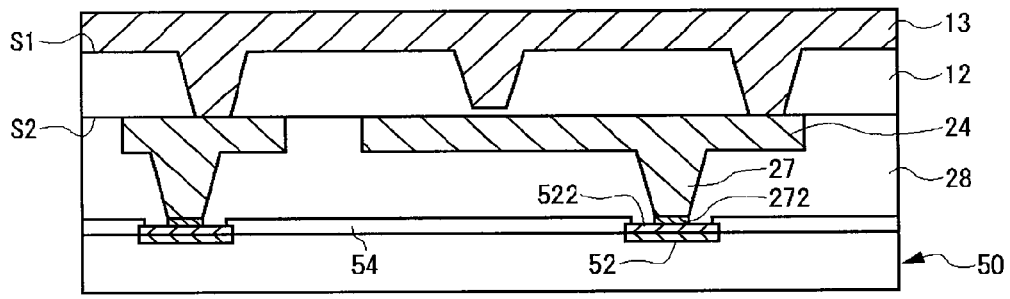

As illustrated in FIG. 14A, the semiconductor device 50 is arranged on one major surface of the insulating resin layer 28 made of the same material as with the insulating resin layer 12, and the copper plate 13 is arranged on the other major surface of the insulating resin layer 28 such that the electrodes 27 face the insulating resin layer 28 side. Then, as illustrated in FIG. 14B, the copper plate 13, the insulating resin layer 28, and the semiconductor device 50 are formed into one body by press-bonding the copper plate 13 and the semiconductor device 50 via the insulating resin layer 28.

Figure 14C:
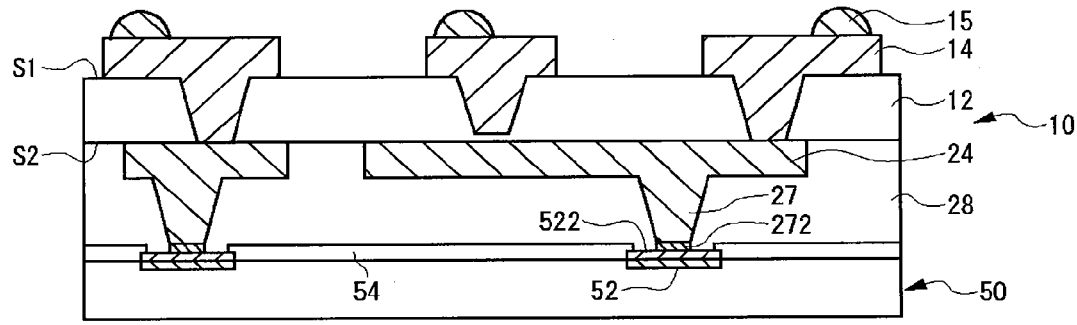

As illustrated in FIG. 14C, resists (not illustrated) are formed selectively in accordance with the pattern of the wiring layer 14 by a lithography process, and the wiring layer 14 with a certain wiring pattern is formed by etching the copper plate 13. The resists are then removed to form solder bumps at certain positions of the wiring layer 14.

The semiconductor module 30 is formed by the production process described above. Or, when the semiconductor device 50 is not pressure-bonded, the substrate 10 for mounting a device is obtained.

In the present embodiment, capacitive coupling is formed between the projected electrode 16a provided on the wiring layer 14 and the wiring layer 24 provided on the other major surface S2 of the insulating resin layer 12. That is, the counter electrode 18 is part of the wiring layer provided on the other major surface S2 of the insulating resin layer 12.

As stated above, the substrate 10 for mounting a device having a multi-layer structure in which a capacitor is formed into one body, and the semiconductor module 30 using the same can also be formed by the method illustrated in the present embodiment.

Embodiment 6

The resent embodiment is different from Embodiments 1 to 5 in a method for forming the projected electrode 16. Hereinafter, the present embodiment will be described. It is noted that a method for connecting the projected electrode 16 and the counter electrode 18 is the same as with Embodiments 1 to 5, and the same structure as in Embodiments 1 to 5 is denoted with the same reference numeral as in Embodiments 1 to 5, and the description with respect thereto is omitted.

FIGS. 15A to 15D are cross-sectional diagrams illustrating a method for forming the projected electrode 16.

Figure 15A:
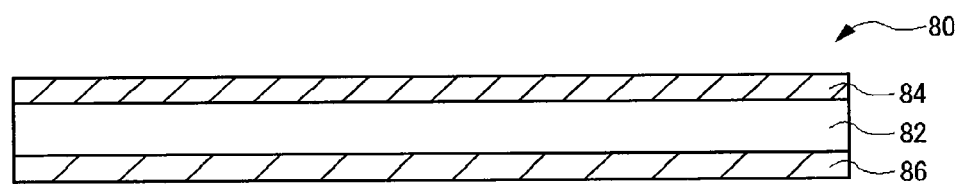
FIGS. 15A to 15D are cross-sectional diagrams illustrating a method for forming a projected electrode according to Embodiment 6.

As illustrated in FIG. 15A, a core substrate 80 comprising an insulating resin layer 82 made of an insulating resin, a first metal layer 84 formed on one major surface of the insulating resin layer 82, and a second metal layer 86 formed on the other major surface thereof, is prepared. The first metal layer 84 and the second metal layer 86 are made of, for example, copper (Cu) or the like.

Figure 15B:
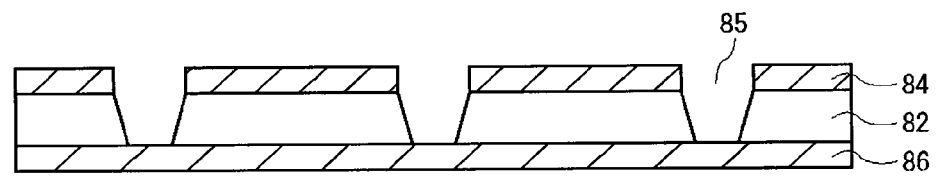

As illustrated in FIG. 15B, parts of the first metal layer 84 and the resin layer 82 are removed to the extent where the second metal layer 86 is exposed, by, for example, irradiating a laser beam from the first metal layer 84 side, such that opening portions 85 are formed. Herein, for example, a carbon dioxide gas laser can be used for irradiating a laser beam. The opening portions 85 are formed in accordance with the pattern of the projected electrodes 16.

Figure 15C:
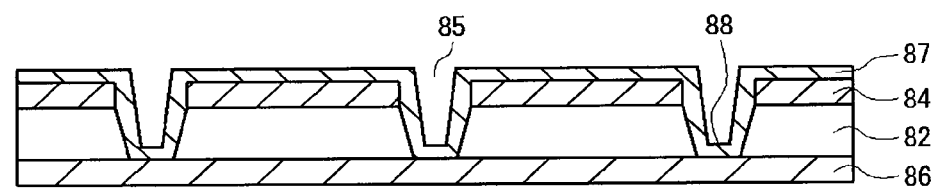

As illustrated in FIG. 15C, a metal plated layer 87 is formed by plating a metal such as copper (Cu) on the interior face of the opening portions 85 by an electrolytic plating process or a non-electrolytic plating process or the like. With this, a via conductor 88 is formed inside the opening portions 85, and the first metal layer 84 and the second metal layer 86 are conducted through the via conductor 88. As the result of the metal plated layer 87 being laminated on the first metal layer 84, the total thickness of the first metal layer 84 and the metal plated layer 87 is adjusted so as to be larger or equal to the thickness of the wiring layer.

Figure 15D:
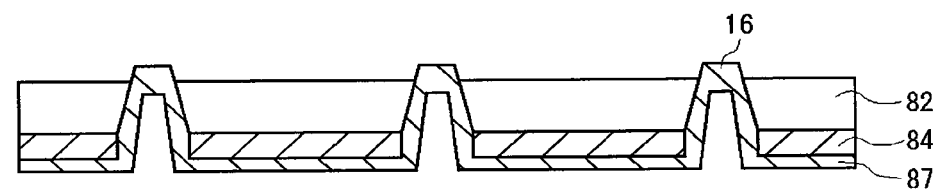

As illustrated in FIG. 15D, the second metal layer 86 and part of the resin layer 82 are then removed by etching. With this, the projected electrodes 16 are formed on the resin layer 82.

As stated above, the substrate 10 for mounting a device and the semiconductor module 30 according to the present invention can also be formed by using the projected electrode 16 formed by the method illustrated in the present embodiment.

Embodiment 7

Figure 16:
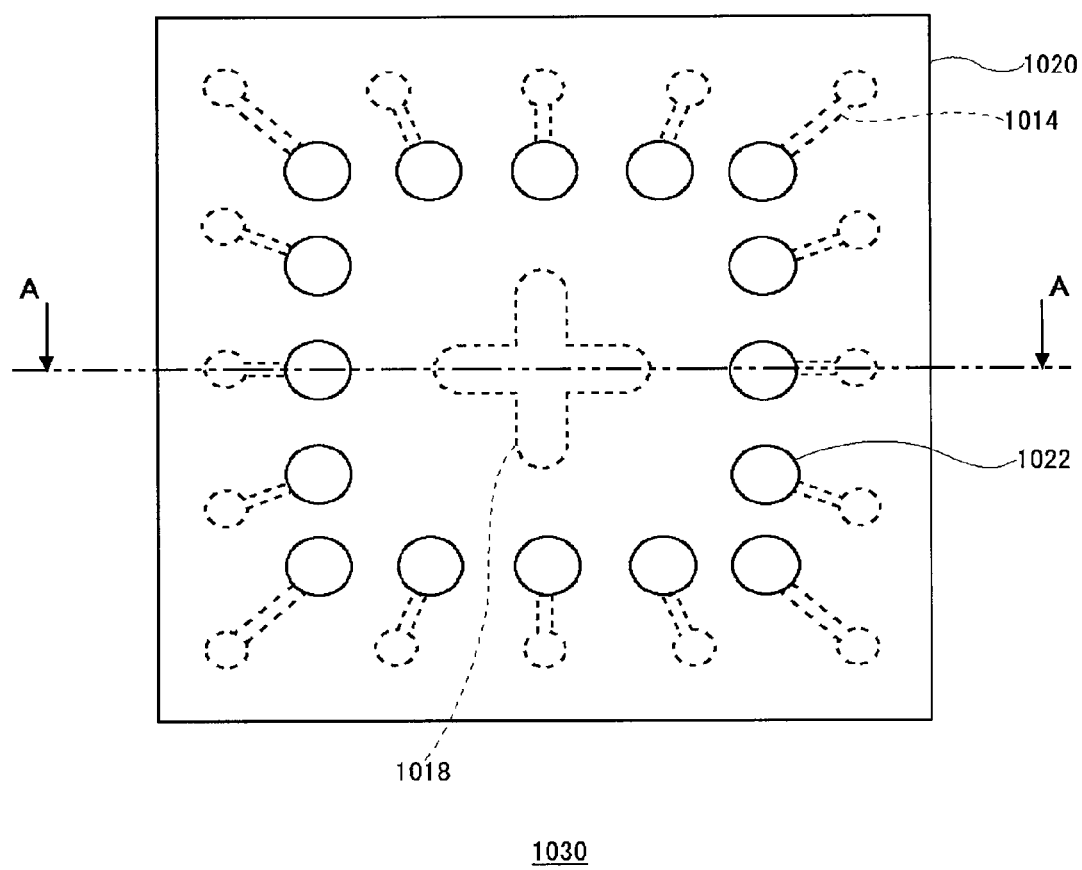
FIG. 16 is a schematic plan diagram illustrating a semiconductor module according to Embodiment 7.
Figure 17:
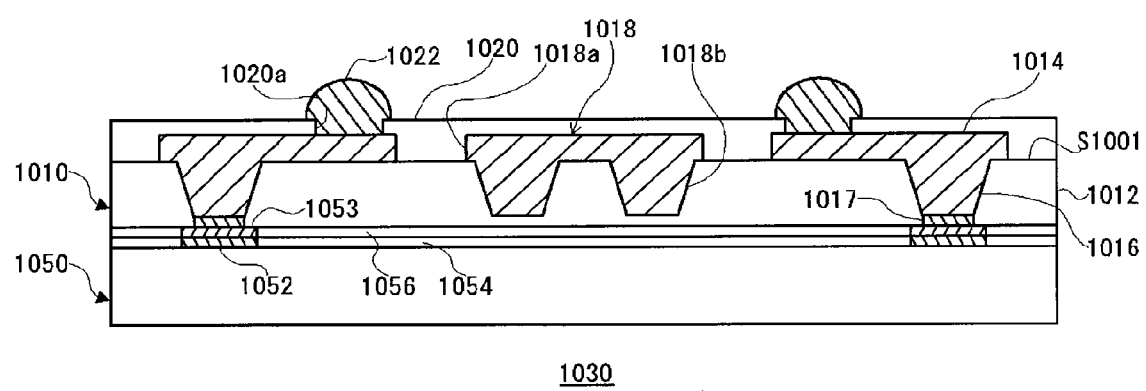
FIG. 17 is a schematic cross-sectional diagram taken along line A-A of FIG. 16.

FIG. 16 is a schematic plan diagram illustrating the semiconductor module 1030 directed to Embodiment 1. FIG. 17 is a schematic cross-sectional diagram taken along line A-A of FIG. 16, illustrating a structure of the substrate 1010 for mounting a device and the semiconductor module 1030 using the same. The semiconductor module 1030 comprises the substrate 1010 for mounting a device and the semiconductor device 1050 mounted on the substrate 1010 for mounting a device. The substrate 1010 for mounting a device comprises: an insulating resin layer 1012; a wiring layer 1014 provided on one major surface S1001 of the insulating resin layer 1012; and a projected electrode 1016 that is connected to the wiring layer 1014 electrically and projects toward the insulating resin layer 1012 from the wiring layer 1014. The substrate 1010 for mounting a device further comprises a backing member 1018 (metal member) at least part of which is embedded in the insulating resin layer 1012, and that is used for backing up the insulating resin layer 1012.

The insulating resin layer 1012 is made of an insulating resin and formed with a material that induces a plastic flow when, for example, pressurized. An example of a material that induces a plastic flow when pressurized includes an epoxy-based thermosetting resin. As an epoxy-based thermosetting resin used for the insulating resin layer 1012, a material may be used as far as the material has a viscosity property of, for example, 1 kPa·s under the condition of a temperature of 160° C. and a pressure of 8 Mpa. When pressurized with a pressure of, for example, 5 to 15 Mpa under the condition of a temperature of 160° C., the epoxy-based thermosetting resin reduces its viscosity to ⅛th-fold in comparison to that when not pressurized. On the other hand, the epoxy resin in the B-stage before thermosetting is less viscous in the same level as that when not pressurized, and not viscous even when pressurized, under the condition of the glass transition temperature Tg or less.

The wiring layer 1014 is provided on one major surface S1001 of the insulating resin layer 1012, and is formed with a conductive material, preferably a rolled metal, further preferably a rolled copper. Alternatively, the wiring layer 1014 may be formed with an electrolyte copper or the like. On the wiring layer 1014 on the side of the insulating resin layer 1012, the projected electrodes 1016 are provided so as to project, in the state of being connected to the wiring layer 1014 electrically. The wiring layer 1014 and the projected electrodes 1016 are preferably formed into one body. With this, occurrence of a crack or the like that is created by a thermal stress in the interfacial surface between the wiring layer 1014 and the projected electrode 1016 can be prevented, and the two can be connected more surely in comparison to the case where the two are formed as separate bodies. Further, because the device electrode 1052 and the wiring layer 1014 can be connected electrically at a same time when the projected electrode 1016 and the device electrode 1052 are pressure-bonded, which is described later, there is an advantage that the number of the production processes is not increased. In an end region of the wiring layer 1014 on the side opposite to the projected electrode 1016, a land region that doubles as a wiring is formed in which a solder bump 1022, which is described later, is arranged on the surface opposite to the side where the projected electrode 1016 is formed.

On the major surface of the wiring layer 1014 on the side opposite to the insulating resin layer 1012, a protecting layer 1020 for preventing oxidation of the wiring layer 1014 or the like is provided. An example of the protecting layer 1020 includes a solder resist layer. An opening portion 1020*a* is formed in a certain region of the protecting layer 1020 corresponding to the land region of the wiring layer 1014 such that the land region of the wiring layer 1014 is exposed at the opening portion 1020*a*. A solder bump 1022, as an external connection electrode, is formed inside the opening portion 1020*a* such that the solder bump 1022 and the wiring layer 1014 are connected electrically. The position where the solder bump 1022 is formed, that is, the region where the opening portion 1020*a* is formed, is an end region where the wiring is put around, for example, in rewiring.

The projected electrode 1016 has, for example, a rounded shape when seen in planar view, and has a side face formed such that the diameter thereof becomes progressively smaller toward the top of the electrode. The shape of the projected electrode 16 is not particularly limited to, and, for example, a cylindrical shape having a certain diameter is also possible. A polygonal shape such as a quadrangle when seen in planar view is also possible. The top face of the projected electrode 1016 is covered with a metal layer 1017 such as a nickel (Ni)/gold (Au) plated layer formed by an electrolytic plating process or a non-electrolytic plating process. The metal layer 1017 may also be a conductive paste layer that is formed by using a conductive paste. In the present embodiment, the metal layer 1017 is formed by a Ni/An plated layer.

The backing member 1018 comprises: a planar portion 1018*a* having an almost cross shape when seen in planar view, which is stacked on one major surface S1001 of the insulating resin layer 1012; and a plurality of projected portions 1018*b* that project toward the insulating resin layer 1012 from the planar portion 1018*a*. The projected portion 1018*b* has a rounded shape when seen in planar view, and has a top face and a side face formed such that the diameter thereof becomes progressively smaller toward the top thereof; and the top face is embedded in the insulating resin layer 1012 from the major surface S1001 of the insulating resin layer 1012, in the state where the top face is parallel to the other major surface of the insulating resin layer 1012. The projected portion 1018*b* of the backing member 1018 enters the insulating resin layer 1012 to backup the insulating resin layer 1012; hence, peeling of the insulating resin layer 1012 from the semiconductor device 1050 can be prevented.

It is preferable that the backing member 1018 is structured such that the top face of the projected portion 1018*b* is positioned inside the insulating resin layer 1012, that is, the top face of the projected portion 1018*b* does not reach the other major surface of the insulating resin layer 1012. In this case, the insulating resin layer 1012 is to lie between the top face of the projected portion 1018*b* of the backing member 1018 and the semiconductor device 1050. With this, because the insulating resin layer 1012_lying between the top face of the projected portion 1018*b* and the semiconductor device 1050, is sandwiched by the projected portion 1018*b* and the semiconductor device 1050, peeling of the insulating resin layer 1012 from the semiconductor device 1050 can be prevented more effectively. In the present embodiment, a height (embedded depth) of the projected portion 1018*b* is made smaller (shallower) than that of the projected electrode 1016 including the metal layer 1017, by providing the metal layer 1017 on the top face of the projected electrode 1016. Due to this, the insulating resin layer 1012 with a thickness similar to that of the metal layer 1017, lies between the projected portion 1018 and the semiconductor device 1050. Also, the top face of the projected portion 1018*b* may be in contact with the semiconductor device 1050.

The backing member 1018 is provided between a pair of the projected electrodes 1016. Herein, because the insulating resin layer 1012 is in pressure contact with the side of the semiconductor device 1050 by the projected electrode 1016, adhesion between the insulating resin layer 1012 and the semiconductor device 1050 is relatively high near the projected electrode 1016, while the adhesion is progressively lower as drawing away from the projected electrode 1016. Accordingly, in the case where an interval between the projected electrodes 1016 penetrating the insulating resin layer 1012 is large, the insulating resin layer 1012 is easy to peel from the semiconductor device 1050 between the projected electrodes 1016.

In the case where the semiconductor device 1050 has an almost quadrangle shape when seen in planar view, and the device electrode 1052, which is described later, is positioned at the periphery of the semiconductor device 1050 in planar view, the projected electrode 1016 is to be positioned at the periphery of the substrate 1010 for mounting a device in planar view, corresponding to the device electrode 1052. In the case, the central region of the insulating resin layer 1012 in planar view is spaced apart from the projected electrode 1016 positioned at the periphery thereof in planar view; hence the insulating resin layer 1012 is easy to peel from the semiconductor device 1050. Therefore, the backing member 1018 is preferably provided at the center of the insulating resin layer 1012 in planar view.

The shape of the backing member 1018 is not particularly limited to, and, for example, the planar portion 1018*a* may also have a shape of an almost quadrangle when seen in planar view. The projected portion 1018*b* may also have a cylindrical shape having a certain diameter or a quadrangle prism or the like, and the number of the projected portions 1018*b* is not limited to. Further, the backing member 1018 may also have a structure in which the planar portion 1018*a* enters the insulating resin layer 1012 without having the projected portions 1018*b*, or may also have only the projected portion 1018*b* instead of the planar portion 1018*a*.

The semiconductor module 1030 is formed by mounting the semiconductor device 1050 on the substrate 1010 for mounting a device provided with the structure stated above. The semiconductor module 1030 according to the present embodiment has a structure in which the projected electrode 1016 of the substrate 1010 for mounting a device and the device electrode 1052 of the semiconductor device 1050 are connected electrically via the insulating resin layer 1012.

The semiconductor device 1050 has the device electrode 1052 facing each of the projected electrodes 1016. The surface of the device electrode 1052 is covered with a metal layer 1053 such as a Ni/Au plated layer. The metal layer 1053 may also be dispensable. An insulating film 1054 such as a silicon dioxide film is provided on the major surface of the semiconductor device 1050 on the side where the device electrode 1052 is provided. Further, a device protecting layer 1056 such as polyimide layer in which an opening portion is provided such that the device electrode 1052 is exposed, is laminated on the major surface of the semiconductor device 1050 on the insulating film 1054 and on the side in contact with the insulating resin layer 1012. Specific example of the semiconductor device 50 includes a semiconductor chip such as an integrated circuit (IC) and a large-scale IC (LSI) or the like. In addition, for example, aluminum (Al) is used for the device electrode 1052.

In the present embodiment, the insulating resin layer 1012 is provided between the substrate 1010 for mounting a device and the semiconductor device 1050, and the projected electrode 1016 penetrating the insulating resin layer 1012 to be connected electrically to the device electrode 1052 provided in the semiconductor device 1050. Because the surface of the projected electrode 1016 and that of the device electrode 1052 are respectively covered with Ni/Au plated layers, the two electrodes are connected via a contact of Au layers (Au—Au contact) that are arranged on the topmost surface. Therefore, the connection reliability between the projected electrode 1016 and the device electrode 1052 can be further improved.

(Method for Producing Substrate for Mounting Device and Semiconductor Module)

Figure 18A:
FIGS. 18A to 18E are cross-sectional diagrams illustrating a method for forming the projected electrode and the projected portion.

FIGS. 18A to 18E and FIGS. 19A and 19B are cross-sectional diagrams illustrating a method for forming the projected electrode 1016 and the projected portion 1018*b*. As illustrated in FIG. 18A, a copper plate 1013 is at first prepared as a metal plate having a thickness that is larger than at least the total of the height of the projected electrode 1016 and the thickness of the wiring layer 1014.

Figure 18B:
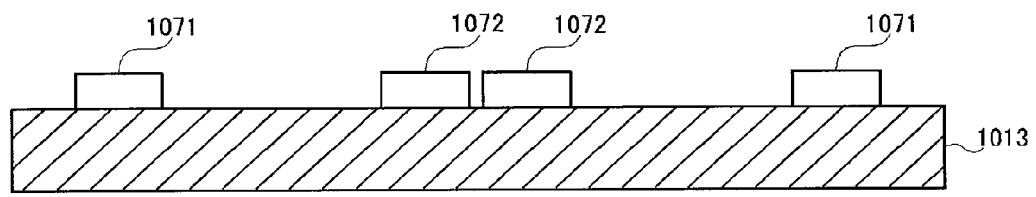

As illustrated in FIG. 18B, resists 1071 are subsequently formed selectively in accordance with the pattern of the projected electrodes 1016 by a lithography process; and resists 1072 are formed selectively in accordance with the pattern of the projected portions 1018*b* of the backing member 1018. Specifically, the resists 71 and 72 are formed selectively on the copper plate 1013 in the following process: a resist film with a certain thickness is attached to the copper plate 1013 by using a laminating apparatus, and exposed by using a photomask with the patterns of the projected electrodes 1016 and the projected portions 1018*b*; and the resist film is then developed. In order to improve the adhesion with the resists, it is preferable that the surface of the copper plate 1013 is subjected to a pretreatment such as grinding and washing or the like before laminating the resist film, if needed.

Figure 18C:
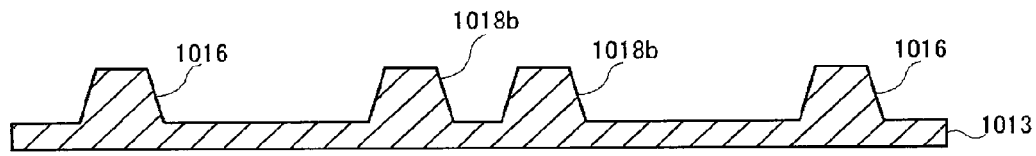

As illustrated in FIG. 18C, certain patterns of the projected electrodes 1016 and the projected portions 1018*b* are then formed on the copper plate 1013, respectively, by using the resists 1071 and 1072 as masks. Specifically, the projected electrodes 1016 and the projected portions 1018*b* with certain patterns are formed respectively by etching the copper plate 1013 with the use of the resists 1071 and 1072 as masks. After forming the projected electrodes 1016 and the projected portions 1018*b*, the resists 1071 and 1072 are subsequently peeled off by using a parting agent.

Figure 18D:
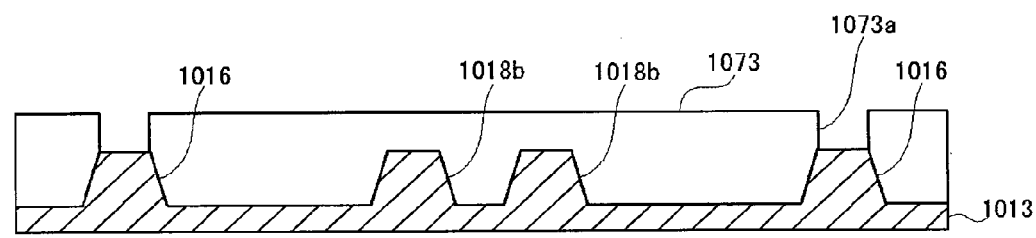

As illustrated in FIG. 18D, a resist 1073 with a plating-resistant property is stacked on the major surface of the copperplate 1013 on the side where the projected electrodes 1016 and the projected portions 1018*b* are formed, by a lithograph process, and opening portions 1073*a* are formed at positions corresponding to the top faces of the projected electrodes 1016.

Figure 18E:
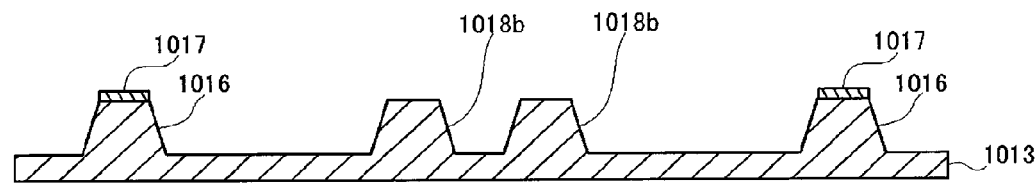

As illustrated in FIG. 18E, metal layers 1017 are formed on the top faces of the projection electrodes 1016 exposed at the opening portions 1073*a*. The metal layers 1017 are formed as Ni/Au metal layers by, for example, an electrolytic plating process or a non-electrolytic plating process. In the case where the metal layers 1017 are formed by an electrolytic plating process or a non-electrolytic plating process, the directions of the crystal grains of the metal that constitutes the metal layers 1017 are aligned in the direction perpendicular to the contact face of the device electrode 1052. Therefore, when pressure-bonded to the device electrode 1052, the pressure exerted on the device electrode 1052 can be absorbed by the metal layer 1017; hence, the fear that the device electrode 1052 could be damaged can be reduced.

The metal layer constituting the metal layer 1017 is formed such that the Ni layer thereof is in contact with the projected electrode 1016 and the Au layer thereof is in contact with the device electrode 1052. A method for forming the metal layer 1017 is not particularly limited thereto, and the metal layer 1017 may also be formed by using a conductive paste such as copper paste, silver paste, and gold paste. The height of the projected electrode 1016 including the metal layer 1017 is larger than that of the projected portion 1018*b* of the backing member 1018, by forming the metal layer 1017 on the top face of the projected electrode 1016. The resist 1073 is peeled off by using a parting agent after forming the metal layer 1017.

Figure 19A:
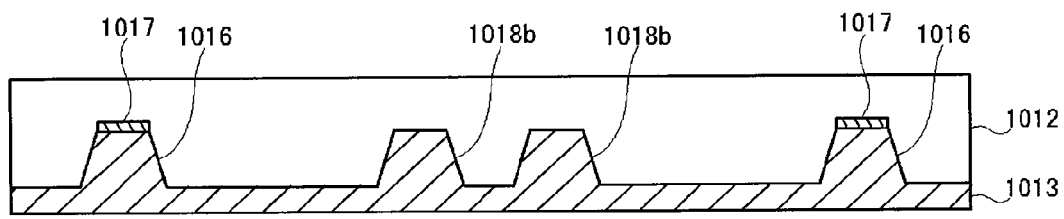
FIGS. 19A and 19B are cross-sectional diagrams illustrating a method for forming the projected electrode and the projected portion.

As illustrated in FIG. 19A, the insulating resin layer 1012 is then stacked on the major surface of the copper plate 1013 on the side where the projected electrodes 1016 and the projected portions 1018*b* are formed.

Figure 19B:
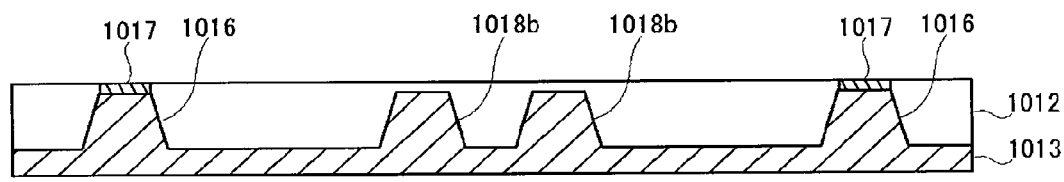

As illustrated in FIG. 19B, a certain amount of the insulating resin layer 1012 is removed by subjecting the major surface of the insulating resin layer 1012 to an etching treatment by, for example, an $O_2$ plasma, such that the metal layer 1017 covering the top face of the projected electrode 1016 is exposed, making the projected electrode 1016 including the metal layer 1017 penetrate the insulating resin layer 1012. The removal of the insulating resin layer 1012 for exposing the metal layer 1017, may also be carried out by subjecting the insulating resin layer 1012 to mechanical grinding.

The projected electrodes 1016 and the projected portions 1018*b* of the backing member 1018 are formed on the copper plate 1013 by the process stated above. In the projected electrode 1016 and the projected portion 1018*b* of the present embodiment, the diameters in the base portions, the diameters in the tip portions, and the heights thereof are, for example, about 60 μmφ, about 40 μmφ, and about 20 μm, respectively. With respect to the thickness of the metal layer 1017, the thickness of the Ni layer is about 1 to 3 μm, and that of the Au layer is about 0.25

Figure 20A:
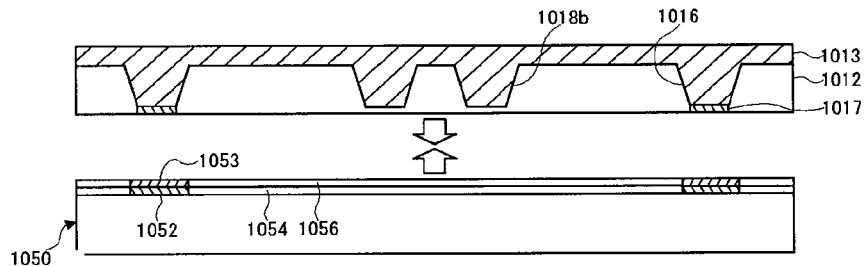
FIGS. 20A to 20E are cross-sectional diagrams illustrating a method for forming the wiring layer and a planar portion, and a method for connecting the projected electrode and the device electrode.
Figure 20B:
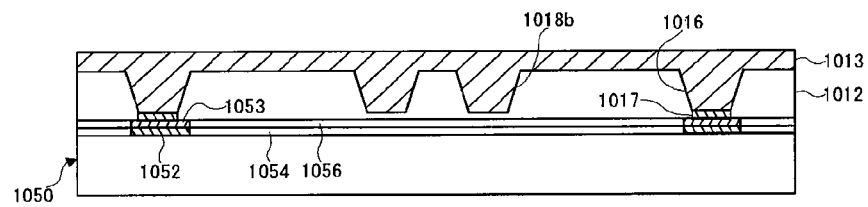

FIGS. 20A to 20E are cross-sectional diagrams illustrating a method for forming the wiring layer 1014 and the planar portion 1018*a*, and a method for connecting the projected electrode 1016 and the device electrode 1052. As illustrated in FIG. 20A, the copper plate 1013 on which the insulating resin layer 1012 is stacked, and the semiconductor device 1050 are arranged such that the projected electrodes 1016 and the device electrodes 1052 face with each other. The copper plate 1013 and the semiconductor device 1050 are then pressure-bonded by using a press machine. The pressure and the temperature at the press working are about 5 Mpa and 200° C., respectively. Due to this, the copper plate 1013, the insulating resin layer 1012, and the semiconductor device 1050 are formed into one body such that the projected electrodes 1016 and the device electrodes 1052 are pressure-bonded to be connected electrically, as illustrated in FIG. 20B. The insulating resin layer 1012 with a thickness similar to that of the metal layer 1017, lies between the top face of the projected portion 1018b and the device protecting layer of the semiconductor device 1050.

Figure 20C:
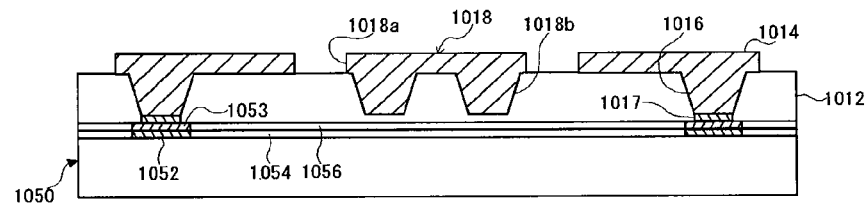

Resists (not illustrated) are then formed selectively in accordance with the patterns of the wiring layer 1014 and the planar portions 1018a of the backing member 1018, on the major surface of the copper plate 13 on the side opposite to the insulating resin layer 1012. As illustrated in FIG. 20C, certain patterns of the wiring layer 1014 and the planar portions 1018a are subsequently formed on the copper plate 1013 by etching the major surface of the copper plate 1013 with the use of the resists as masks, followed by removal of the resists. The planar portions 1018a are formed in the regions where the projected portions 1018b are present, and the backing member 1018 is completed by forming the planar portions 1018a. In the present embodiment, the thickness of the wiring layer 1014 and the planar portion 1018a are about 15 to 20 µm, respectively. Alternatively, the backing member 1018 may also be structured by only the projected portions 1018b by etching the copper plate 1013, without forming the resists at the position where the planar portions 1018a are to be formed.

Herein, because the projected electrodes 1016, the projected portions 1018b, and the planar portions 1018a are formed by the same copper plate 1013, the backing member 1018 and the projected electrode 1016 are made of the same material. In addition, because the projected portions 1018b and the planar portions 1018a are formed at a same time when the projected electrodes 1016 and the wiring layer 1014 are formed, respectively, the number of the production processes for forming the backing member 1018 is not needed to be increased, allowing an increase in the production cost to be suppressed.

Figure 20D:
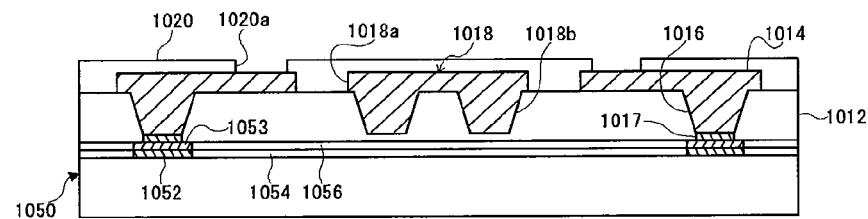
Figure 20E:
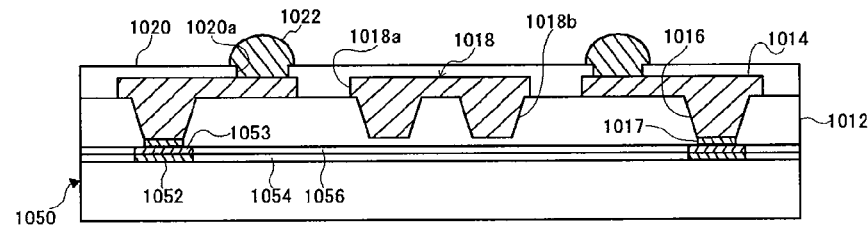

As illustrated in FIG. 20D, a protecting layer 1020 having opening portions 1020a in the regions corresponding to the positions where solder bumps 1022 are to be formed, is formed on the major surface of the wiring layer 1014 and the planar portions 1018a on the side opposite to the insulating resin layer 1012. As illustrated in FIG. 20 E, the solder bumps 1022 are then formed within the opening portions 1020a. A semiconductor module 1030 can be formed by the production process stated above. Or, when the semiconductor device 1050 is not mounted, the substrate 1010 for mounting a device can be obtained.

From a general overview of operation effects by the structure stated above, the substrate 1010 for mounting a device and the semiconductor module 1030 according to the present embodiment are provided with the backing member 1018 for backing up the insulating resin layer 1012, on the insulating resin layer 1012. In particular, the backing member 1018 is provided between a pair of the projected electrodes 1016, further at the center of the insulating resin layer 1012 in planar view. And, the projected portion 1018b of the backing member 1018 is embedded in the insulating resin layer 1012 to back up the insulating resin layer 1012. With this, peel of the insulating resin layer 1012 from the semiconductor device 1050 can be prevented, allowing the connection reliability between the projected electrode 1016 and the device electrode 1052 to be improved. As a result, when the semiconductor module 1030 is implemented on a printed wiring board, the connection reliability between the semiconductor device 1050 and the printed wiring board can be improved.

Moreover, because the insulating resin layer 1012 lies between the top face of the projected portion 1018b and the semiconductor device 1050, the insulating resin layer 1012 lying between the two is in the state of being sandwiched by the two. Therefore, peel of the insulating resin layer 1012 from the semiconductor device 1050 can be prevented more effectively. If the insulating resin layer 1012 is peeled from the semiconductor device 1050, moisture or the like included in atmosphere enters a void created as a result of the peeling, which could be a cause of corrosion of the semiconductor module 1030; however, creation of such a void can be suppressed according to the present embodiment, allowing the reliability of the semiconductor module 1030 to be improved.

Further, because the protecting layer 1020 covers the planar portion 1018a of the backing member 1018, the covering area thereof is large, allowing the adhesion property of the protecting layer 1020 to be improved. In addition, in the present embodiment, the backing member 1018 lies across the protecting layer 1020 and the insulating resin layer 1012; hence, the adhesion between the protecting layer 1020 and the insulating resin layer 1012, in particular, the adhesion against a horizontal stress is improve, allowing the connection reliability between the projected electrode 1016 and the device electrode 1052 to be more improved, further allowing the connection reliability between the substrate 1010 for mounting a device and the semiconductor device 1050 to be more improved.

Embodiment 8

In Embodiment 7 stated above, the height of the projected electrode 1016 including the metal layer 1017 is made larger than that of the projected portion 1018b of the backing member 1018 by providing the metal layer 1017 on the top face of the projected electrode 1016, thereby the insulating resin layer 1012 lying between the projected portion 1018b and the semiconductor device 1050. Different from Embodiment 7, the insulating resin layer 1012 is made so as to lie between the projected portion 1018b and the semiconductor device 1050 by making the height of the projected portion 1018b itself smaller than that of the projected electrode 1016 in Embodiment 8. Hereinafter, the present embodiment will be described. It is noted that the structures of the substrate 1010 for mounting a device and the semiconductor module 1030 or the like, the method for forming the wiring layer 1014 and the planar portion 1018a, and the method for connecting the projected electrode 1016 and the device electrode 1052 are basically the same as with Embodiment 7; and the same structure as in Embodiment 7 is denoted with the same reference numeral as in Embodiment 7, and the description with respect thereto is omitted appropriately.

Figure 21:
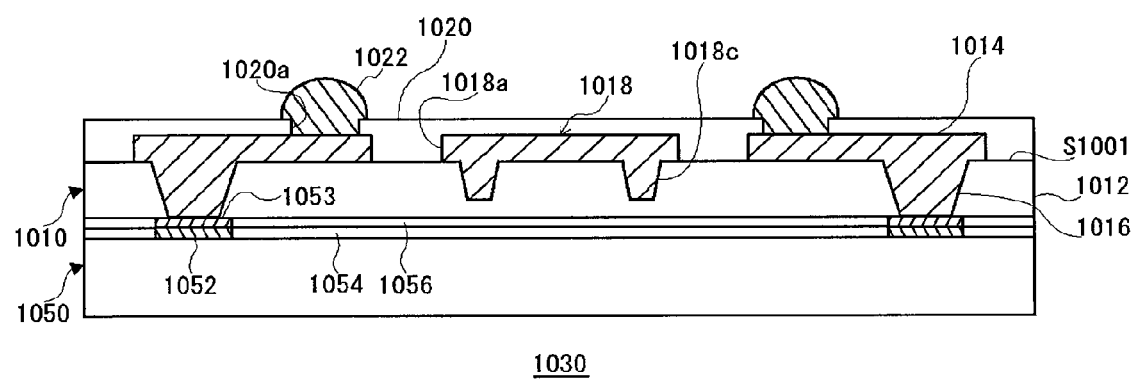
FIG. 21 is a schematic cross-sectional diagram illustrating a structure of a substrate for mounting a device and a semiconductor module using the same according to Embodiment 8.
Figure 22:
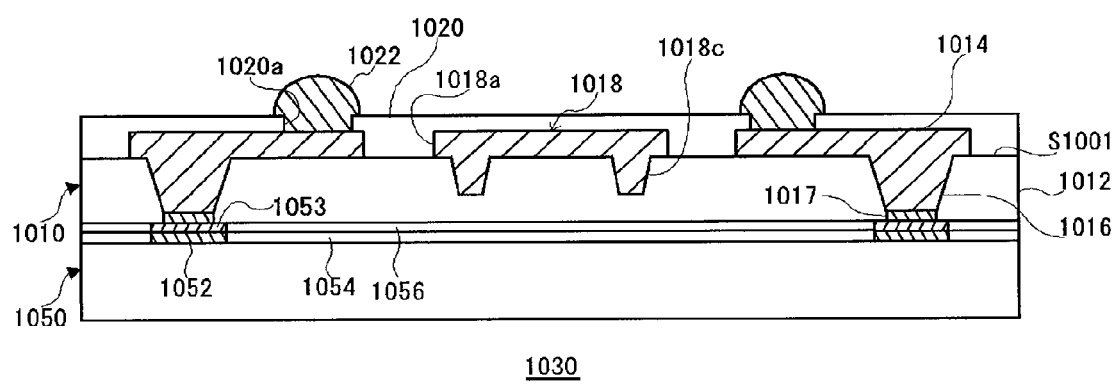
FIG. 22 is a schematic cross-sectional diagram illustrating the structure of the substrate for mounting a device and the semiconductor module using the same.

FIGS. 21 and 22 are schematic cross-sectional diagrams illustrating a structure of the substrate 1010 for mounting a device and the semiconductor module 1030 using the same according to Embodiment 8. As illustrated in FIG. 21, the substrate 1010 for mounting a device according to the present embodiment is provided with the backing member 1018 having the projected portion 1018c with a height smaller than that of the projected electrode 1016. Different from Embodiment 7, the height of the projected portion 1018c itself is smaller than that of the projected electrode 1016; hence the insulating resin layer 1012 can be made so as to lie between the projected portion 1018c and the device protecting layer 1056 of the semiconductor device 1050, without providing the metal layer 1017 on the top face of the projected electrode 1016. As illustrated in FIG. 22, the metal layer 1017 may also be provided on the top face of the projected electrode 1016 in order to improve the connection reliability between the projected electrode 1016 and the device electrode 1052 by connecting the two with an Au—Au contact.

FIGS. 23A to 23E, and FIGS. 24A and 24B are cross-sectional diagrams illustrating a method for forming the projected electrodes 1016 and the projected portions 1018c. A description will be made taking the case where the metal layer 1017 is provided, as an example.

Figure 23A:
FIGS. 23A to 23E are cross-sectional diagrams illustrating a method for forming the projected electrode and the projected portion.

As illustrated in FIG. 23A, a copper plate 1013 is at first prepared as a metal plate having a thickness that is larger than at least the total of the height of the projected electrode 1016 and the thickness of the wiring layer 1014.

Figure 23B:
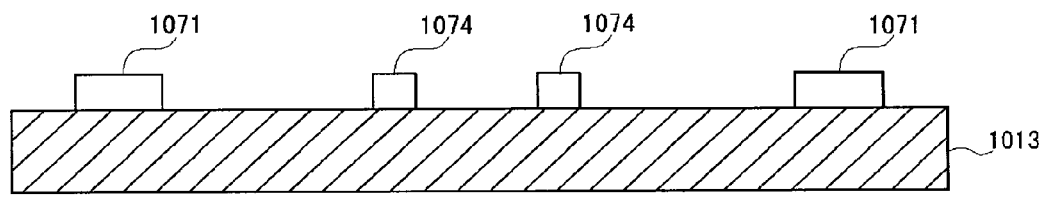

As illustrated in FIG. 23B, resists 1071 are subsequently formed selectively in accordance with the pattern of the projected electrodes 1016 by a lithography process; and resists 1074 are formed selectively in accordance with the pattern of the projected portions 1018c of the backing member 1018. The size of the resist 1074 should be smaller or equal to the resolution limit in etching the copper plate 1013, which will be described later.

Figure 23C:
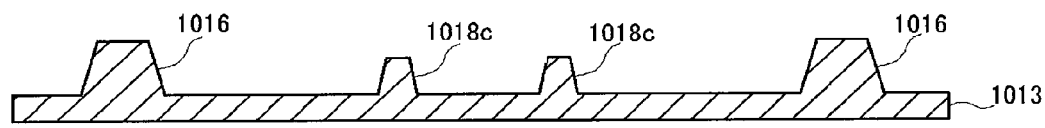

As illustrated in FIG. 23C, certain patterns of the projected electrodes 1016 and the projected portions 1018c are then formed on the copper plate 1013, respectively, by using the resists 1071 and 1072 as masks. Herein, the size of the resist 1074 formed in accordance with the pattern of the projected portions 1018c is smaller or equal to the resolution limit in etching. Therefore, when performing, for example, a wet etching that develops isotropically on the copper plate 13, the copper plate 1013 directly below the resist 1074 is progressively etched from the side face thereof, as the etching develops. Therefore, the height of the projected portions 1018c formed by the resist 1074 is made smaller than that of the projected electrode 1016. Alternatively, the height of the projected portions 1018c may be made smaller than that of the projected electrode 1016 by removing the top portion of the projected portions 1018c with the use of etching or the like, after forming the projected portions 1018c having the same height as that of the projected electrodes 1016. After forming the projected electrodes 1016 and the projected portions 1018c, the resists 1071 and 1074 are peeled off by using a parting agent.

Figure 23D:
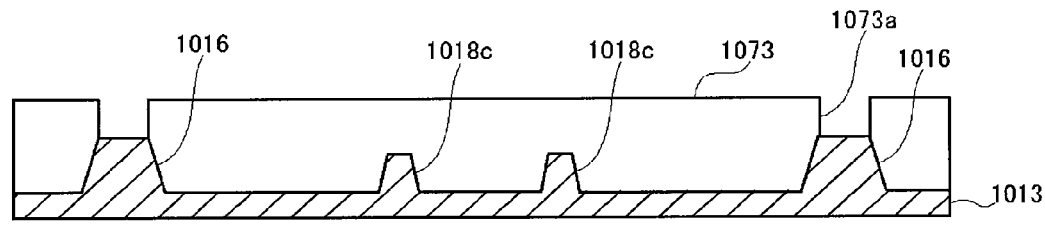
Figure 23E:
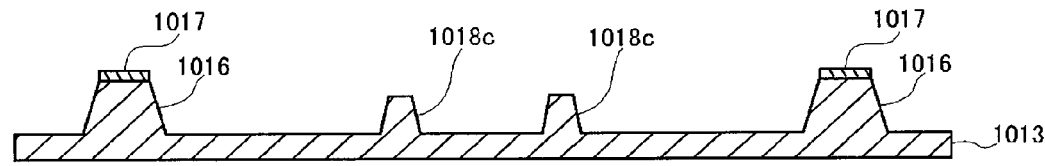

As illustrated in FIG. 23D, a resist 1073a with a plating-resistant property is stacked on the major surface of the copper plate 1013 on the side where the projected electrodes 1016 and the projected portions 1018c are formed, by a lithograph process, and opening portions 1073a are formed at the positions corresponding to the top faces of the projected electrodes 1016. As illustrated in FIG. 23E, the metal layers 1073 are subsequently formed on the top faces of the projected electrodes 1016 exposed at the opening portions 1073a, and the resist 1073 is peeled off by using a parting agent.

Figure 24A:
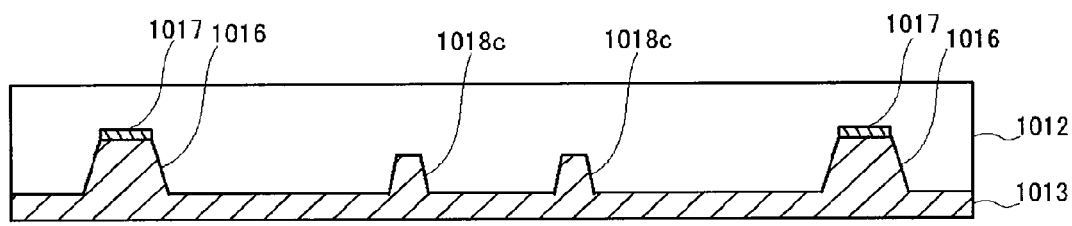
FIGS. 24A and 24B are cross-sectional diagrams illustrating the method for forming the projected electrode and the projected portion.
Figure 24B:
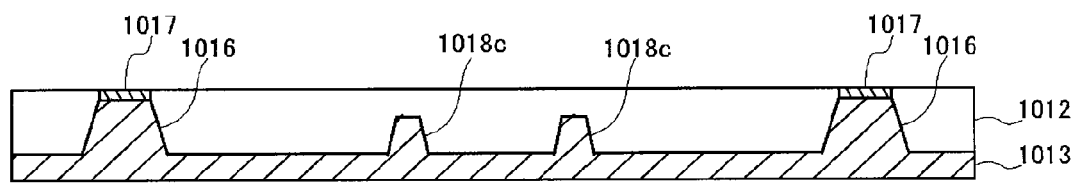

As illustrated in FIG. 24A, the insulating resin layer 1012 is then stacked on the major surface of the copper plate 1013 on the side where the projected electrodes 1016 and the projected portions 1018c are formed. Subsequently, as illustrated in FIG. 24B, a certain amount of the insulating resin layer 1012 are removed to expose the metal layers 1017 such that the projected electrodes 1016 including the metal layers 1017 penetrate the insulating resin layer 1012.

The projected electrodes 1016 and the projected portions 1018c of the backing member 1018 are formed on the copper plate 1013 by the process stated above. In the projected portion 1018c of the present embodiment, the diameter in the base portion, the diameter in the top portion, and the height thereof are, for example, about 40 µmϕ, about 20 µmϕ, and about 15 µm, respectively.

The copper plate 1013 on which the projected electrodes 1016 and the projected portions 1018c are formed, and on which the insulating resin layer 1012 is stacked, by the process stated above, is pressure-bonded to the semiconductor device 1050 in the same way as with Embodiment 1; thereby, the projected electrodes 1016 and the device electrodes 1052 are connected electrically, allowing the semiconductor module 1030 to be formed.

As stated above, according to Embodiment 8, the following advantages can be further obtained in addition to the above advantages of Embodiment 7. That is, in the present embodiment, the insulating resin layer 1012 is made so as to lie between the projected portions 1018c and the device protecting layer 1056 of the semiconductor device 1050, by making the size of the projected portion 1018c itself of the backing member 1018 smaller than that of the projected electrode 1016. Therefore, because the thickness of the insulating resin layer 1012 lying between the projected portion 1018c and the device protecting layer 1056 can be freely set, peeling of the insulating resin layer 1012 from the semiconductor device 1050 can be prevented more effectively. As a result of that, the connection reliability between the projected electrode 1016 and the device electrode 1052 can be further improved.

Embodiment 9

A portable apparatus provided with the semiconductor module of the present invention will be described below. An example will be taken in which the semiconductor module is mounted on a portable phone as the portable apparatus; however, the portable apparatus may also be an electronic apparatus such as, for example, a personal digital assistance (PDA), a digital camcorder (DVC), and a digital still camera (DSC).

Figure 25:
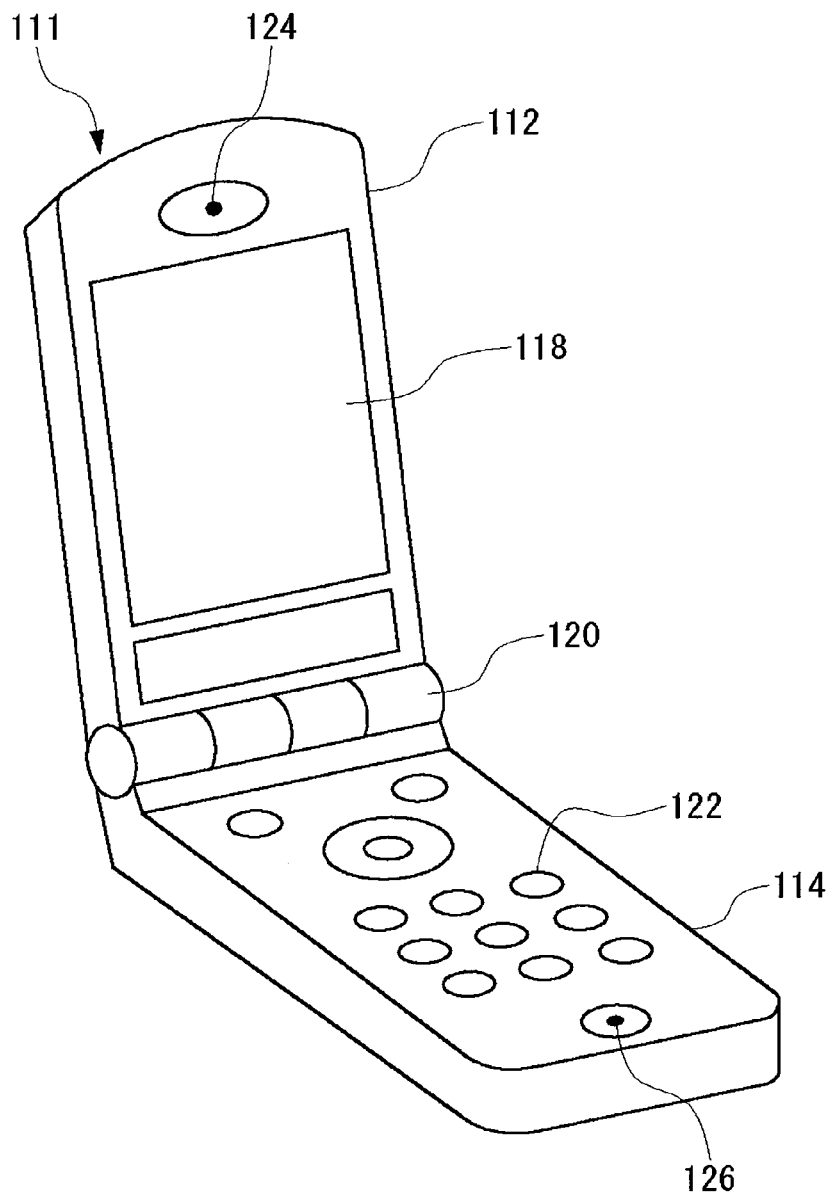
FIG. 25 is a diagram illustrating a structure of a portable phone according to Embodiment 9.

FIG. 25 is a diagram illustrating the structure of a portable phone provided with the semiconductor modules 30 and 1030 directed to each Embodiment stated above. The portable phone 111 has a structure in which the first case 112 and the second case 114 are connected by the movable portion 120. The first case 112 and the second case 114 are pivoted on the movable portion 120. On the first case 112, the display unit 118 displaying information such as characters and images or the like, and the speaker unit 124 are provided. On the second case 114, the manipulation unit 122 such as manipulation buttons or the like, and the microphone unit 126 are provided. The semiconductor modules 30 and 1030 directed to each Embodiment of the present invention is mounted inside such portable phone 111.

Figure 26:
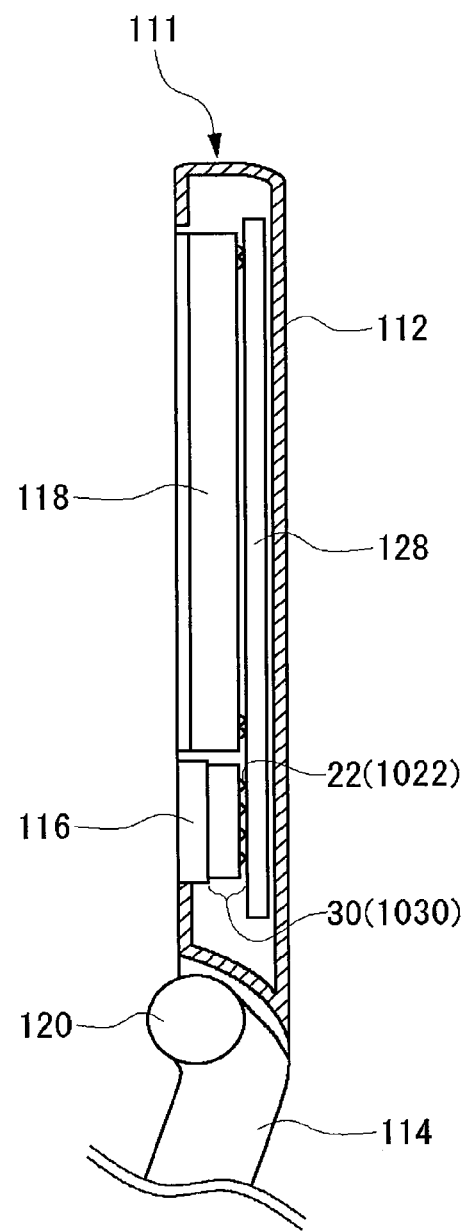
FIG. 26 is a partial cross-sectional diagram of the portable phone.

FIG. 26 is a partial cross-sectional diagram of the portable phone illustrated in FIG. 25 (cross-sectional diagram of the first case 112). The semiconductor modules 30 and 1030 directed to each Embodiment of the present invention are mounted on the printed wiring board 128 via the solder bumps 22 and 1022 to be connected electrically to the display unit 118 or the like via such printed wiring board 128. A heat-dissipating substrate 116 such as a metal substrate is provided on the back face side of the semiconductor modules 30 and 1030 (on the face opposite to the solder bumps 22 and 1022) such that, for example, the heat generated by the semiconductor modules 30 and 1030 is efficiently dissipated toward the outside of the first case 112 without persisting therein.

The semiconductor module 30 directed to the above Embodiments 1 to 6 can be miniaturized and can be reduced in its production cost; hence the portable apparatuses in which such semiconductor module 30 is mounted can also be miniaturized and can be reduced in their production cost. In addition, according to the substrate 1010 for mounting a device and the semiconductor module 1030 directed to each of the above Embodiments 7 and 8, the connection reliability between the projected electrode 1016 and the device electrode 1052 can be improved; hence, the implementation reliability when the semiconductor module 1030 is implemented on a printed wiring board. Therefore, the reliability of the portable apparatuses directed to the present embodiment, in which such semiconductor module 1030 is mounted, can be improved.

The present invention should not be limited to each of the above embodiments, and various modifications, such as design modifications, may be made based on knowledge of a person skilled in the art. Embodiments in which such modifications are added should also fall within the scope of the present invention.

For example, in each above Embodiment, the wiring layer of the substrate for mounting a device has a single-layer or two-layer structure; however, the wiring layer may also have a multi-layer structure without being limited thereto. In addition, the wiring layer has the solder bumps formed on the exterior surface thereof, but the wiring layer should not be limited thereto. For example, the wiring layer may also have a MOS transistor adhered thereto, of which source electrode, drain electrode, and gate electrode are connected to the wiring layer electrically.

Moreover, the structure of the present invention can be applied to the production process of semiconductor packages referred to as the "Wafer Level CSP (Chip Size Package) Process". With the process, semiconductor modules can be made thinner and be miniaturized.

What is claimed is:

1. A method for producing a substrate for mounting a device, comprising:
   preparing a metal plate on one major surface of which a plurality of projected electrodes are provided;
   forming an insulating resin layer on said major surface so as to cover the top surface of the projected electrodes;
   exposing the top surface of at least one of the plurality of projected electrodes by removing the insulating resin layer so that a major surface of the insulating resin layer opposite to the metal plate is level;
   arranging a plurality of counter electrodes having a counterface to face the top face of the plurality of projected electrodes;
   electrically connecting the at least one of the plurality of projected electrodes, the top surface of which is exposed, with at least one of the plurality of counter electrodes facing the projected electrodes, by pressure-bonding the metal plate with the counter electrode; and
   forming a wiring layer by selectively removing the metal plate.

2. The method according to claim 1, further comprising:
   adjusting, between the preparing and the connecting, a projected length of at least one of the plurality of projected electrodes excluding the projected electrode electrically connected to the counter electrode so as to be smaller than that of the projected electrodes electrically connected to the counter electrode;
   wherein the connecting includes arranging the plurality of counter electrodes to face the top face of the plurality of projected electrodes, and capacitively-coupling the projected electrode adjusted to have a smaller projected length with the counter electrode opposite thereto via a dielectric body.

3. The method according to claim 1, further comprising:
   providing another wiring layer on the insulating resin layer adjacent to the top face of the projected electrodes,
   wherein the counter electrode forms a part of the other wiring layer.

4. A method for producing a semiconductor module, comprising:
   preparing a metal plate on one major surface of which a plurality of projected electrodes are provided;
   forming an insulating resin layer on said major surface so as to cover a top surface of the projected electrodes;
   exposing the top surface of at least one of the plurality of projected electrodes by removing the insulating resin layer so that a major surface of the insulating resin layer opposite to the metal plate is level;
   arranging a semiconductor device having a plurality of device electrodes to face the top face of the plurality of projected electrodes;
   electrically connecting at least one of the plurality of projected electrodes, the top surface of which is exposed, with the at least one of the plurality of device electrodes facing the projected electrodes, by pressure-bonding the metal plate with the semiconductor device; and
   forming a wiring layer by selectively removing the metal plate.

5. The method according to claim 1, further comprising:
   adjusting, between the preparing and the connecting, a projected length of at least one of the plurality of projected electrodes excluding the projected electrodes electrically connected to the device electrodes so as to be smaller than that of the projected electrodes electrically connected to the device electrodes;
   wherein the connecting includes arranging the semiconductor device such that the device faces the top face of each of the plurality of projected electrodes, and capacitively-coupling the projected electrodes adjusted to have a smaller projected length with the device electrodes opposite thereto via a dielectric body.

6. The method according to claim 1,
   wherein the connecting includes pressure-bonding the metal plate and the semiconductor device via the insulating resin layer, capacitively-coupling a part of the projected electrode with the corresponding device electrode, and electrically connecting the other projected electrodes with the corresponding device electrodes.

7. The method according to claim 6,
   wherein the insulating resin layer induces plastic flow when pressurized.

* * * * *